(12) United States Patent
Torii et al.

(10) Patent No.: US 9,876,511 B2
(45) Date of Patent: Jan. 23, 2018

(54) MEMORY SYSTEM AND MEMORY CONTROL METHOD

(71) Applicant: Toshiba Memory Corporation, Minato-ku (JP)

(72) Inventors: Osamu Torii, Setagaya (JP); Yoshiyuki Sakamaki, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 11 days.

(21) Appl. No.: 15/064,078

(22) Filed: Mar. 8, 2016

(65) Prior Publication Data
US 2017/0077958 A1  Mar. 16, 2017

Related U.S. Application Data

(60) Provisional application No. 62/217,294, filed on Sep. 11, 2015.

(51) Int. Cl.
| | | |
|---|---|---|
| *H03M 13/11* | (2006.01) | |
| *H03M 13/29* | (2006.01) | |
| *G06F 11/10* | (2006.01) | |
| *H03M 13/00* | (2006.01) | |
| *G11C 29/52* | (2006.01) | |

(52) U.S. Cl.
CPC ..... *H03M 13/1191* (2013.01); *G06F 11/1068* (2013.01); *H03M 13/2909* (2013.01); *H03M 13/618* (2013.01); *G11C 29/52* (2013.01)

(58) Field of Classification Search
CPC ............. G06F 11/1072; G06F 11/1088; G06F 11/1096; G06F 11/1012; G06F 11/1068; H03M 13/116; H03M 13/1137; H03M 13/618; H03M 13/2909; H03M 13/1191
See application file for complete search history.

(56) References Cited

U.S. PATENT DOCUMENTS

| | | | | |
|---|---|---|---|---|
| 8,341,502 | B2* | 12/2012 | Steiner | G06F 11/1012 714/755 |
| 8,650,457 | B1* | 2/2014 | Yeo | H03M 13/1137 714/755 |
| 2005/0149840 | A1 | 7/2005 | Lee et al. | |
| 2010/0153812 | A1 | 6/2010 | Jin et al. | |
| 2011/0154151 | A1* | 6/2011 | Matsumoto | H03M 13/116 714/752 |
| 2012/0173947 | A1 | 7/2012 | Voicila et al. | |

OTHER PUBLICATIONS

Justesen, Iterated decoding of modified product codes in optical networks, Feb. 2, 2009, IEEE, pp. 1 to 4.*

(Continued)

*Primary Examiner* — Shelly A Chase
(74) *Attorney, Agent, or Firm* — Oblon, McClelland, Maier & Neustadt, L.L.P.

(57) ABSTRACT

A memory system includes a non-volatile memory. A coding unit generates a codeword by performing coding of a graph code using a graph. A side of the graph is associated with a block that is a part of user data and that has one or more symbols at which component codes intersect one another. A control unit stores the codeword in the non-volatile memory. Error correction is performed on the user data in accordance with the codeword.

16 Claims, 22 Drawing Sheets

(56) References Cited

OTHER PUBLICATIONS

Justesen et al., Analysis of Iterated hard decision decoding of product codes with Reed Solomon component codes, 2007, IEEE, pp. 174-177.*

Irina E. Bocharova, et al., "Woven Graph Codes: Asymptotic Performances and Examples", IEEE Trans. Inform. Theory 56(1), 2010, 19 pgs.

Tom Hoholdt, et al., "The Minimum Distance of Graph Codes", http://orbit.dtu.dk/fedora/objects/orbit:28195/datastreams/file_5637417/content, 2011, 12 pgs.

* cited by examiner

FIG.3

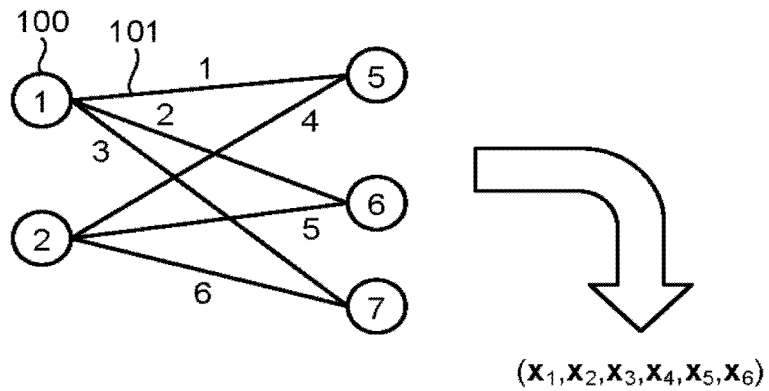

VERTEX 1

PARITY CHECK MATRIX $H_1 = \begin{pmatrix} 1 & 1 & 0 \\ 1 & 0 & 1 \end{pmatrix}$ COLUMN NUMBER ASSOCIATION $\phi_1((1,2,3)) = (1,2,3)$ EXPANDED MATRIX $\overline{H}_1 = \begin{pmatrix} 1 & 1 & 0 & 0 & 0 & 0 \\ 1 & 0 & 1 & 0 & 0 & 0 \end{pmatrix}$

VERTEX 2

PARITY CHECK MATRIX $H_2 = \begin{pmatrix} 1 & 1 & 0 \\ 1 & 0 & 1 \end{pmatrix}$ COLUMN NUMBER ASSOCIATION $\phi_2((1,2,3)) = (4,5,6)$ EXPANDED MATRIX $\overline{H}_2 = \begin{pmatrix} 0 & 0 & 0 & 1 & 1 & 0 \\ 0 & 0 & 0 & 1 & 0 & 1 \end{pmatrix}$ $$H' = \begin{pmatrix} \overline{H}_1 \\ \vdots \\ \overline{H}_7 \end{pmatrix}$$

| 1 | 1 | 1 | 1 | 0 | 0 |
|---|---|---|---|---|---|
| 1 | 0 | 1 | 0 | 1 | 0 |
| 1 | 1 | 0 | 0 | 0 | 1 |

FIG.16

| 1 | 0 | 0 | 1 | 1 | 1 |
|---|---|---|---|---|---|
| 0 | 1 | 0 | 1 | 0 | 1 |
| 0 | 0 | 1 | 1 | 1 | 0 |

FIG.17

VERTEX 1: (1,2,3,4,5,6) ↦ (1,2,3,19,22,25)
VERTEX 2:(1,2,3,4,5,6) ↦ (4,5,6,20,23,26)
VERTEX 3:(1,2,3,4,5,6) ↦ (7,8,9,21,24,27)
VERTEX 4:(1,2,3,4,5,6) ↦ (1,4,7,10,11,12)
VERTEX 5:(1,2,3,4,5,6) ↦ (2,5,8,13,14,15)
VERTEX 6:(1,2,3,4,5,6) ↦ (3,6,9,16,17,18)
VERTEX 7:(1,2,3,4,5,6) ↦ (10,13,16,19,20,21)
VERTEX 8:(1,2,3,4,5,6) ↦ (11,14,17,22,23,24)
VERTEX 9:(1,2,3,4,5,6) ↦ (12,15,18,25,26,27)

| 0 | 1 |
|---|---|
| 1 | 1 |
| 1 | 0 |
| 1 | 1 |
| 0 | 1 |
| 1 | 0 |
| 0 | 0 |
| 0 | 0 |
| 1 | 0 |
| 1 | 1 |
| 0 | 1 |
| 1 | 0 |
| 0 | 1 |
| 1 | 1 |
| 1 | 0 |
| 0 | 0 |
| 0 | 0 |
| 1 | 0 |
| 0 | 1 |
| 1 | 1 |
| 1 | 0 |
| 1 | 1 |
| 0 | 1 |
| 1 | 0 |
| 0 | 0 |
| 0 | 0 |
| 1 | 0 |

FIG.26

| | VERTEX 1 | VERTEX 2 | VERTEX 3 | VERTEX 4 | VERTEX 5 | VERTEX 6 |
|---|---|---|---|---|---|---|
| 27 | | | 0 | 0 | 0 | 0 |
| 26 | | 1 | 1 | 1 | 1 | 1 |
| 25 | 1 | 1 | 1 | 1 | 1 | 1 |
| 24 | | | 1 | 1 | 1 | 1 |
| 23 | | 0 | 0 | 0 | 0 | 0 |
| 22 | 1 | 1 | 1 | 1 | 1 | 1 |
| 21 | | | 0 | 0 | 0 | 0 |
| 20 | | 0 | 0 | 0 | 0 | 0 |
| 19 | 1 | 1 | 1 | 1 | 1 | 1 |
| 18 | | | | | | 1 |
| 17 | | | | | | 0 |
| 16 | | | | | | 1 |
| 15 | | | | | 0 | 0 |
| 14 | | | | | 1 | 1 |
| 13 | | | | | 1 | 1 |
| 12 | | | | 0 | 0 | 0 |
| 11 | | | | 0 | 0 | 0 |
| 10 | | | | 1 | 1 | 1 |
| 9 | | | 0 | 0 | 0 | 0 |
| 8 | | | 1 | 1 | 1 | 1 |
| 7 | | | 1 | 1 | 1 | 1 |
| 6 | | 1 | 1 | 1 | 1 | 1 |
| 5 | | 0 | 0 | 0 | 0 | 0 |
| 4 | | 1 | 1 | 1 | 1 | 1 |
| 3 | 0 | 0 | 0 | 0 | 0 | 0 |
| 2 | 0 | 0 | 0 | 0 | 0 | 0 |
| 1 | 1 | 1 | 1 | 1 | 1 | 1 |

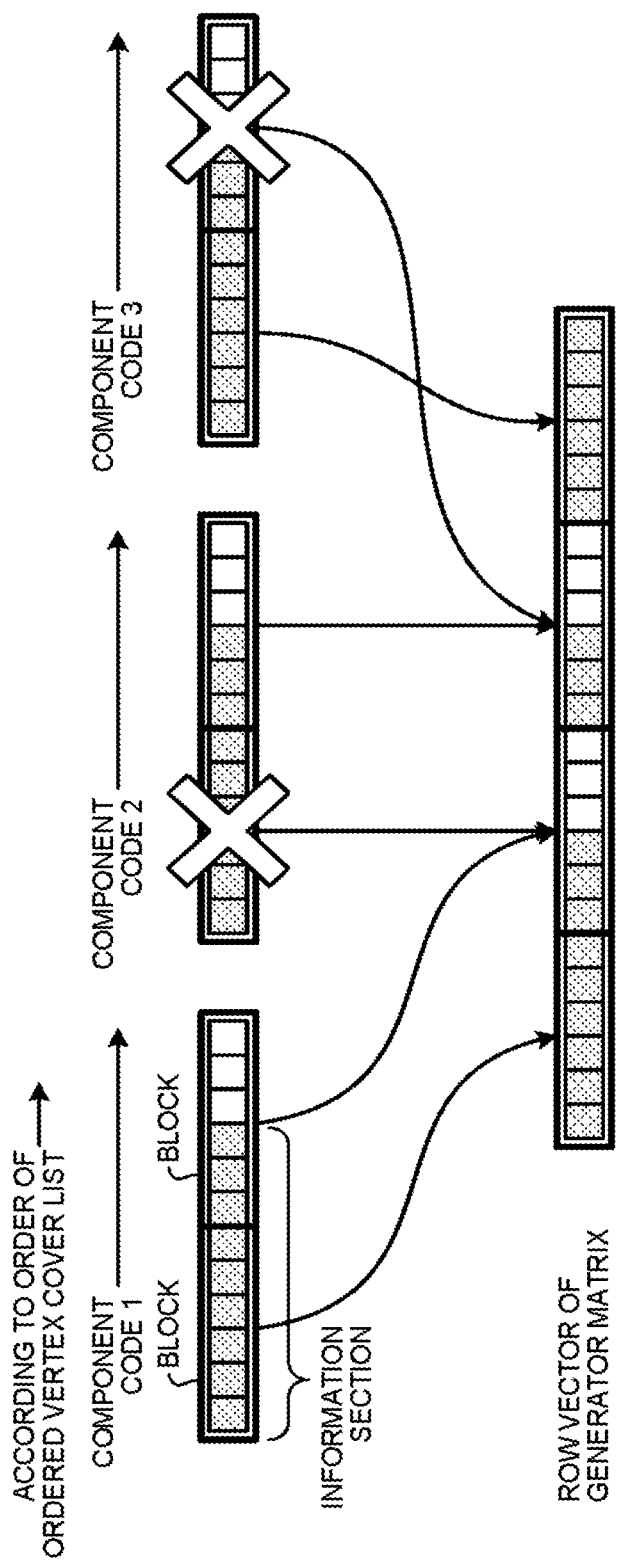

MEMORY SYSTEM AND MEMORY CONTROL METHOD

CROSS-REFERENCE TO RELATED APPLICATIONS

This application is based upon and claims the benefit of priority from U.S. Provisional Application No. 62/217,294, filed on Sep. 11, 2015; the entire contents of which are incorporated herein by reference.

FIELD

Embodiments described herein relate generally to a memory system and a memory control method.

BACKGROUND

In general, data is stored after being subjected to error correction coding in memory systems in order to protect the data to be stored. A product code that two-dimensionally generates a codeword has been known as an example of the error correction coding.

BRIEF DESCRIPTION OF THE DRAWINGS

FIG. 3 is a diagram illustrating an example of a graph to be configured of five vertexes and six sides;

FIG. 4 is a diagram illustrating an example of a parity check matrix for each vertex in the graph illustrated in FIG. 3;

FIG. 14 is a diagram illustrating a connection matrix of the graph illustrated in FIG. 13;

FIG. 15 is a diagram illustrating an example of a parity check matrix of a component code;

FIG. 16 is a diagram illustrating an example of a generator matrix of the component code that is associated with the parity check matrix illustrated in FIG. 15;

FIG. 17 is a diagram illustrating an example of a block map that is associated with the graph illustrated in FIG. 13;

FIG. 19 is a diagram illustrating the parity check matrix after erasing an element that becomes a zero row vector according to linear dependency;

FIG. 20 is a diagram illustrating a graph code generator matrix calculated using the parity check matrix illustrated in FIG. 19;

FIG. 21 is a diagram illustrating a row-reduced echelon matrix transformed from the graph code generator matrix illustrated in FIG. 20;

FIG. 26 is a diagram for describing decompression of the row vector $g_i$; and

FIG. 27 is a diagram illustrating a compressed image in a case in which a block size is six.

DETAILED DESCRIPTION

In general, according to an embodiment, a memory system includes: a non-volatile memory; a coding unit that generates a codeword by performing coding of a graph code using a graph of which a side is associated with a block, the block being a part of user data and having one or more symbols at which component codes intersect one another; and a control unit that stores the codeword in the non-volatile memory.

Hereinafter, a memory system and a memory control method according to embodiments will be described in detail with reference to the attached drawings. Incidentally, the present invention is not limited to the embodiment.

First Embodiment

Figure 1:
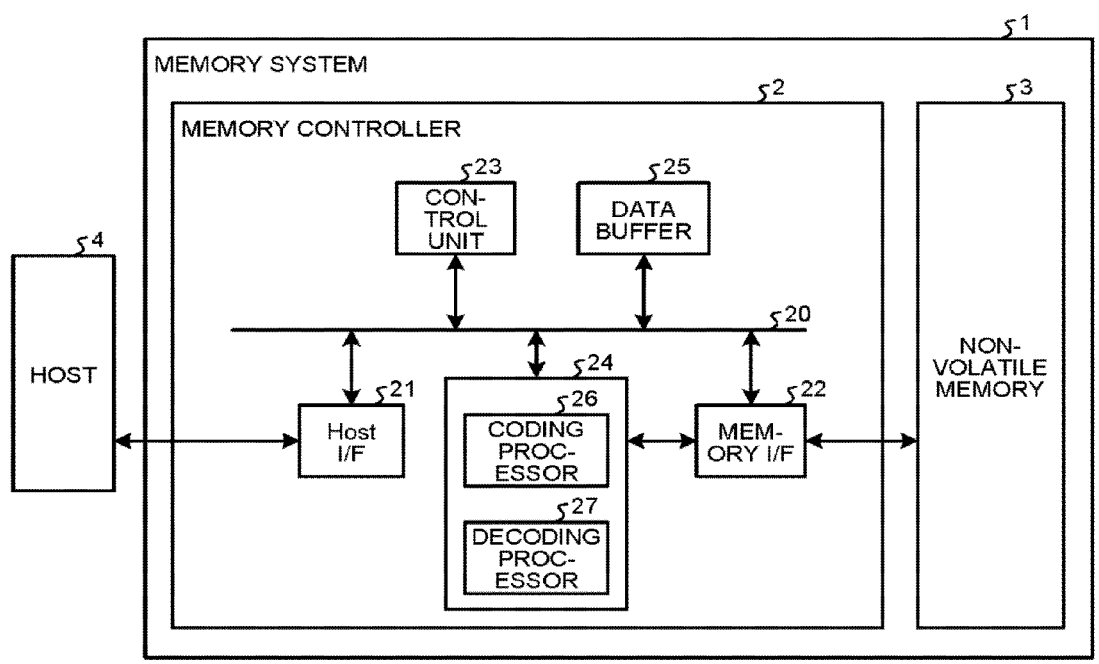
FIG. 1 is a block diagram illustrating a configuration example of a memory system according to a first embodiment.

FIG. 1 is a block diagram illustrating a configuration example of a memory system (storage device) according to an embodiment. A memory system 1 according to a first embodiment is provided with a memory controller 2 and a non-volatile memory 3. The memory system 1 is capable of being connected with a host 4, and FIG. 1 illustrates a state in which the memory system 1 is connected with the host 4. The host 4 is electronic equipment, for example, a personal computer, a mobile phone and the like.

The non-volatile memory 3 is a non-volatile memory that stores data in a non-volatile manner, and is a NAND memory, for example. Although a description will be given with an example in which the NAND memory is used as the non-volatile memory 3 here, a memory unit other than the NAND memory, such as a three-dimensional structure flash memory, a resistance random access memory (ReRAM), or a ferroelectric random access memory (FeRAM) as the non-volatile memory 3. Further, although a description will be given with an example in which a semiconductor memory is used as the memory unit here, error correction processing of the first embodiment may be applied to a memory system in which a memory unit other than the semiconductor memory is used.

The memory system 1 may be a memory card or the like in which the memory controller 2 and the non-volatile memory 3 are configured as a single package, may be a solid state drive (SSD), or the like.

The memory controller 2 controls write to the non-volatile memory 3 according to a write command (request) from the host 4. Further, the memory controller 2 controls read from the non-volatile memory 3 according to a read command from the host 4. The memory controller 2 is provided with a host interface (host I/F) 21, a memory interface (memory I/F) 22, a control unit 23, an error check and correct (ECC) unit 24 and a data buffer 25. The host I/F 21, the memory I/F 22, the control unit 23, the ECC unit 24 and the data buffer 25 are connected to one another via an internal bus 20.

The host I/F 21 executes a process according to the interface standard with the host 4, and outputs a command, user data, and the like received from the host 4 to the internal bus 20. Further, the host I/F 21 transmits the user data read from the non-volatile memory 3, a response from the control unit 23, and the like to the host 4. Incidentally, in the first embodiment, data written into the non-volatile memory 3 according to the write request from the host 4 is referred to as the user data. In the first embodiment, the user data is coded and written into the non-volatile memory 3 as a codeword as will be described later.

The memory I/F 22 performs a write process to the non-volatile memory 3 based on an instruction of the control unit 23. Further, the memory I/F 22 performs a read process from the non-volatile memory 3 based on an instruction of the control unit 23.

The control unit 23 is a control unit that comprehensively controls various components of the memory system 1. In the case of receiving a command from the host 4 via the host I/F 21, the control unit 23 performs control according to the command. For example, the control unit 23 instructs the memory I/F 22 to write a codeword (the coded user data) to the non-volatile memory 3 according to the command from the host 4. Further, the control unit 23 instructs the memory I/F 22 to read a codeword that is associated with data of an object to be read from the non-volatile memory 3 according to the command from the host 4.

Further, in the case of receiving the write request from the host 4, the control unit 23 determines a storage are (memory area) on the non-volatile memory 3 with respect to the user data to be stored in the data buffer 25. That is, the control unit 23 manages a write destination of the user data. An association between a logical address of the user data received from the host 4, and a physical address that indicates the storage area on the non-volatile memory 3 in which the user data is stored, is stored as an address conversion table. In the first embodiment, since the user data is coded and stored in the non-volatile memory 3 as described above, the control unit 23 determines the write destination on the non-volatile memory 3 in unit of the codeword.

Further, in the case of receiving the read request from the host 4, the control unit 23 converts the logical address instructed by the read request into the physical address using the above-described address conversion table, and instructs the memory I/F 22 to perform read from the physical address.

In the NAND memory, the write and the read are generally performed in a data unit of a so-called page, and erase is performed in a data unit of a so-called block. In the embodiment, a plurality of memory cells to be connected to the same word line are referred to as a memory cell group. In a case in which the memory cell is a single-level cell (SLC), one memory cell group is associated with one page. In a case in which the memory cell is a multi-level cell (MLC), one memory cell group is associated with a plurality of the pages. Further, each memory cell is connected not only to the word line, but also to a bit line. Each memory cell can be identified by an address that identifies the word line, and an address that identifies the bit line.

The data buffer 25 temporarily stores the user data until the memory controller 2 stores the user data received from the host 4 in the non-volatile memory 3. Further, the data buffer 25 temporarily stores the user data read from the non-volatile memory 3 until being transmitted to the host 4. The data buffer 25 is configured using a general-purpose memory, for example, a static random access memory (SRAM), a dynamic random access memory (DRAM), or the like. The user data transmitted from the host 4 is transferred to the internal bus 20 and stored in the data buffer 25.

The ECC unit 24 codes the user data (user data stored in the data buffer 25) received from the host 4 to generate the codeword. The ECC unit 24 is provided with a coding processor 26 and a decoding processor 27.

Here, coding of the first embodiment will be described. An error correction technique is used for securing a data quality in the memory system and communication. Reed-Solomon code and BCH code have been known as representatives of error correction codes. Further, there are many cases of using a plurality of codes in combination in order to improve a correction performance.

A graph code has been known as the error correction code obtained by combining the plurality of codes. The graph code is obtained by defining a set of vertexes and a side connecting between the vertexes in advance, and associates the side, which extends from the vertex for each vertex, with a component code. The total number of sides extending from each vertex regarding the entire vertex is a code length of the graph code. Each side is associated with a plurality of the vertexes, and accordingly, each side belongs to a plurality of the component codes.

In the graph code, it is possible to improve the error correction performance by increasing the component code, but the code length of the entire graph code is also increased when increasing the component code. Thus, it is difficult to increase the component code in a case in which there is a restriction in the code length of the entire graph code. Therefore, the increase in the code length of the entire graph code is suppressed while increasing the component code through blocking of a part at which the component codes intersect one another in the graph code (component-code intersection), that is, a part that is associated with one side in the first embodiment. The blocking that blocks the component-code intersection indicates to setting the component-code intersection to a block configured of one or more symbols.

There is a product code as the error correction code obtained by combining the plurality of codes, and information is protected in a dual manner by combining the component codes of two directions in the product code. However, when the blocking is performed in the product code, a parity of one of the component codes of the product code is protected only in a single manner. On the contrary, it is possible to protect the parities of the component codes in a multiple manner in the graph code even in the case of performing the blocking.

Further, a generator matrix of the graph code (hereinafter, referred to as a graph code generator matrix) is not a systemic generator matrix, in general. Thus, the codeword is converted into the information using coding inverse mapping at the time of decoding. Accordingly, calculation time for decoding increases. Therefore, a graph code generator matrix G is subjected to row-based transformation to obtain the row-reduced echelon matrix, and an index that indicates a non-zero starting position of each row of the row-reduced echelon matrix is calculated in the first embodiment. When a vector that indicates information to be coded (an information vector) is set to u, and a vector that indicates a codeword to be generated by the graph code generator matrix is set to c, c=uG. Accordingly, when a non-zero starting column of an i-th row (i is an integer of one or more) of the graph code generator matrix is set to a row i', an i'-th component of c is an i-th component of u. When this index is used, it is easy to convert the received word associated with c to the information vector at the time of decoding. In the first embodiment, such an index is referred to as a graph code information section index, and a number that indicates a row and the graph code information section index are associated with one another and saved as the graph code information section index data (hereinafter, abbreviated as the information section index data as appropriate). Further, when the information section index data is used at the time of decoding, the calculation time is shortened. Incidentally, the component code is a systematic code in the first embodiment. Incidentally, although a description will be given with an example in which decoding is performed using the information section index data in the following description, the decoding may be performed without using the information section index data.

Figure 2:
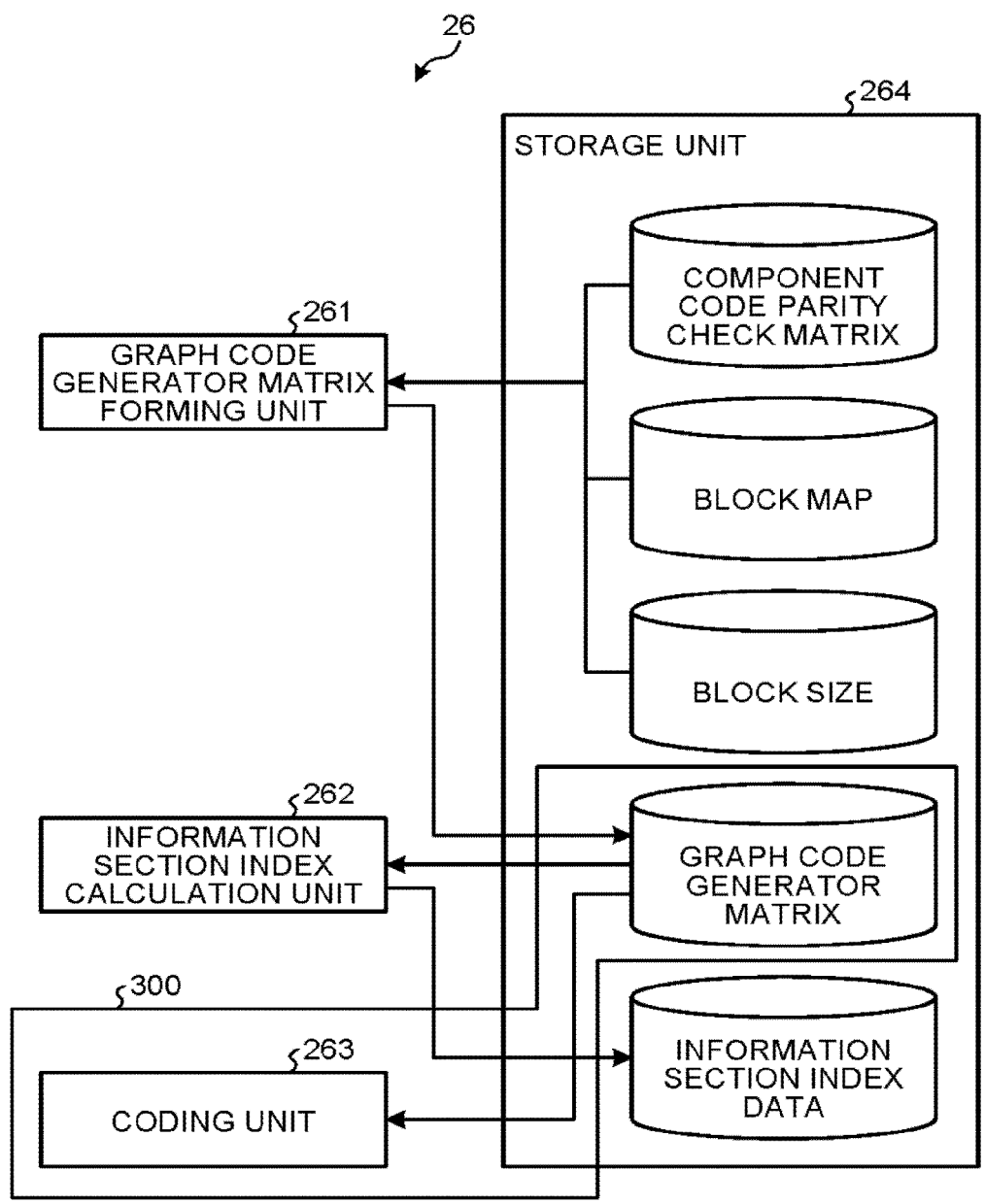
FIG. 2 is a diagram illustrating a configuration example of a coding processor of the first embodiment.

FIG. 2 is a diagram illustrating a configuration example of the coding processor 26 of the first embodiment. As illustrated in FIG. 2, the coding processor 26 according to the first embodiment is provided with a graph code generator matrix forming unit 261, an information section index calculation unit 262, a coding unit 263, and a storage unit 264. Incidentally, the storage unit 264 may not be inside the coding processor 26, and may be inside the memory controller 2.

A coding arithmetic unit 300 illustrated in FIG. 2 represents a part to be used in the case of performing coding of the graph code after the graph code generator matrix is generated.

The graph code generator matrix forming unit 261 calculates the graph code generator matrix based on a component code parity check matrix, a block map, and a block size, which are stored in the storage unit 264 in advance, and stores the generated graph code generator matrix in the storage unit 264. The component code parity check matrix is a parity check matrix of each component code. The block map is a map that indicates a side to which a vertex is connected with a number attached to the side in the entire graph for each vertex. That is, the block map is the map that indicates the association between a defined number of a side among sides that is associated with a vertex, and a number attached to the side in the entire graph. The parity check matrix and the generator matrix of the component code are defined in association with a defined number of a side in the vertex, and thus, there is a need for defining and storing such an association in order to generate the parity check matrix of the graph code based on the parity check matrix of the component code. A connection relationship between each vertex and each side of the graph code is defined in advance, and numbers are attached to the respective vertexes and the respective sides.

For example, it is assumed that the total number of sides forming a graph is six, and numbers of 1 to 6 are attached to the respective sides. Further, it is assumed that a vertex 1 is connected with three sides, and numbers of 1, 2, and 3 are attached to the respective sides among those three sides, and a vertex 2 is connected to with three sides, and numbers of 1, 2, and 3 are attached to the respective sides among those three sides. The sides having the numbers of 1, 2, and 3 of the vertex 1 are assumed to be associated with 1, 2, and 3 among numbers allocated to sides in the entire graph, and the sides having the numbers of 1, 2, and 3 of the vertex 2 are assumed to be associated with 4, 5, and 6 among numbers allocated to sides in the entire graph. In this case, the block map is the information in which (1, 2, 3) are associated with (1, 2, 3) regarding the vertex 1, and (1, 2, 3) are associated with (4, 5, 6) regarding the vertex 2.

Here, a description will be given regarding a calculation method (formation method) of the graph code generator matrix of the first embodiment. First, terms to be used in the first embodiment will be described. A finite field (Galois field) of an order q is expressed as GF(q). An element of the finite field GF(q) is referred to as a symbol. A codeword of a code length n is n symbol columns. Typically, data is handled with a binary number in digital data, the codeword is handled as a vector on a finite field $GF(2^r)$. Accordingly, a single symbol of the codeword includes r bits as the digital data. In the case of a binary code (r=1), the bit and the symbol are the same. Further, a code of the code length n, a dimension k, and a minimum distance d are expressed as an (n, k, d) code. Incidentally, the (n, k, d) code is expressed as an (n, k) code by omitting the minimum distance d in some cases.

A general graph code (graph code that does not block the component-code intersection) is defined as follows. A graph Q=(T, R) is defined as an undirected graph. Reference sign T is a set of vertexes of the graph, R indicates a set of sides of the graph. The graph Q is assumed to be connected without a loop or an overlapping side. Further, it is assumed that numbers are attached to each of the sides and vertexes of the graph, and the number of the vertexes is V, and the number of the sides is E.

When a subspace is defined based on a characteristic of the graph Q in an E-dimensional vector space $GF(q)^E$ on GF(q), a code is defined as follows. The number of vertexes of the graph Q is set to V, and the number of sides thereof is set to E. A set of a side that extends from an i-th vertex (i=1, 2, . . . , V) of the graph Q is set to R(i). An element of the set R(i) is indicated by each number defined with respect to E sides. A vector space $GF(q)^{n(i)}$ is considered by setting the number of the elements that belong to R(i) to n(i). A single bijection $\varphi_i$ to R(i) from the set $\{1, 2, \ldots, n(i)\}$ of the numbers indicating n(i) sides is defined. A code $C_i$ to be defined by a parity check matrix $H_i$ is defined with the vector space $GF(q)^{n(i)}$ as the subspace. Reference sign $C_i$ is a component code of a code length n(i). When $C_i$ is an (n(i), k(i), d(i)) code, $H_i$ is a matrix of (n(i)−k(i))×k(i). Here, a matrix obtained by expanding $H_i$ to a matrix of (n(i)−k(i))×E is set to $H_i$(bar), and $H_i$(bar) is defined such that a column j of $H_i$ is copied onto a column $\varphi_i(j)$ of $H_i$(bar), and a column having a column number other than R(i) is set to a zero column vector. Reference sign $\varphi_i(j)$ indicates a j-th number of R(i).

The matrix $H_i$(bar) expanded from $H_i$ is obtained regarding the entire i of 1 to V. At this time, a subspace C of $GF(q)^E$ that is perpendicular to a row vector of the matrix H' represented by the following Formula (1) is referred to as the graph code of the graph Q. The parity check matrix of the graph code is a matrix to be obtained by performing the row-based transformation to set the row vectors of the matrix H' the row vector to be linearly independent. Further, any component that becomes a zero row vector according to the linear dependency in H' is removed from H'.

$$H' = \begin{pmatrix} \overline{H}_1 \\ \overline{H}_2 \\ \ldots \\ \overline{H}_V \end{pmatrix} \quad (1)$$

Although the description has been given regarding the typical graph code as above, the component-code intersection is blocked as described above in the first embodiment. That is, a block, which includes b (b is an integer of one or more) symbols on GF(q) in Q=(T,R) described above, is associated with one side. A vector $x_e$ that indicates a block associated with an e-th side is set as the following Formula (2).

$$x_e = (x_e^1, x_e^2, \ldots, x_e^b) \quad (2)$$

As represented by the following Formula (3), a vector x on $GF(q)^N$ is obtained by arranging $x_e$ in the order of side numbers from 1 to E.

$$x = (x_1, \ldots, x_E) \quad (3)$$

Incidentally, N=bE. In the first embodiment, the code is defined by defining the subspace based on the characteristic of the graph Q in the vector space $GF(q)^N$. A set of a side that extends from an i-th vertex (i=1, 2, ..., V) of the graph Q is set to R(i). An element of the set R(i) is indicated by each number defined with respect to E sides. The numbers of the elements that belong to R(i) is set to z(i), and n(i) is defined as z(i)b=n(i). At this time, a single bijection $\varphi_i$ to R(i) from the set {1, 2, ..., z(i)} of numbers indicating z(i) sides is defined. In the first embodiment, $\varphi_i$ is referred to as the block map. A code $C_i$ to be defined by the parity check matrix $H_i$ is defined with a vector space $GF(q)^{z(i)b}$ as the subspace. Reference sign $C_i$ is a component code of a code length n(i). When $C_i$ is an (n(i), k(i), d(i)) code, $H_i$ is a matrix of (n(i)−k(i))×k(i). Here, a matrix obtained by expanding $H_i$ to a matrix of (n(i)−k(i))×N is set to $H_i$(bar), and $H_i$(bar) is calculated as follows. First, the entire component of $H_i$(bar) is set to zero. Regarding the entire j from 1 to n(i), b column vectors, which include a column ((i−1)b+1) to a column ib of the matrix $H_i$, are copied onto a column $(\varphi_i(j)−1)b+1)$ to a column $\varphi_i(j)b$, respectively. Reference sign $\varphi_i(j)$ indicates a j-th number of R(i).

The matrix $H_i$(bar) expanded from $H_i$ is obtained regarding the entire i of 1 to V. At this time, when the matrix H' represented by Formula (1) is defined as similar to the typical graph code described above, a subspace C of $GF(q)^N$ that is perpendicular to the row vector of the matrix H' is referred to as a b-block graph code, or simply as a block graph code. The parity check matrix of the graph code is a matrix to be obtained by performing the row-based transformation to set the row vectors of the matrix H' the row vector to be linearly independent. $C_i$ is a component code which is associated with an i-th vertex (a vertex i) of the block graph code.

A description will be given regarding a calculation method of the parity check matrix in the block graph code as described above with a simple specific example. FIG. 3 is a diagram illustrating an example of a graph to be configured of five vertexes and six sides. In the example of FIG. 3, five vertexes 100 are attached with numbers of 1, 2, 5, 6, and 7.

A numerical value described inside a circle that represents the vertex 100 indicates the number of the vertex. Further, numbers of 1, 2, and 3 are set to sides each of which connects the vertex 1, which is a first vertex, with each of the vertexes 5, 6, and 7, and numbers of 4, 5, and 6 are set to sides each of which connects the vertex 2 with each of the vertexes 5, 6, and 7. The vectors $x_1, x_2, \ldots, x_6$ indicating blocks are associated with the sides, respectively. Accordingly, the vector $x=(x_1, x_2, \ldots, x_6)$ on $GF(q)^{6b}$ is set. Reference sign b indicates a block size.

Next, a component code having a code length of (the number of sides extended from a vertex)×b is determined for each of the vertexes by defining the parity check matrix. FIG. 4 is a diagram illustrating an example of a parity check matrix for each vertex in the graph illustrated in FIG. 3. In the example of FIG. 4, it is assumed that b=1 for simplification. A parity check matrix $H_1$ to be associated with the vertex 1, and a parity check matrix $H_2$ to be associated with the vertex 2 are defined as illustrated in the FIG. 3. In the example of FIG. 4, the number of sides associated with each of the vertexes 1 and 2 is three, and thus, the code length n is 3×b=3, and the dimension k is 2. In the example illustrated in FIG. 4, although the parity check matrix in association with each component code of the vertexes 5, 6, and 7 is not illustrated, it is possible to define the parity check matrix also for each of the vertexes 5, 6, and 7 similar to the vertexes 1 and 2.

As illustrated in FIGS. 3 and 4, when a set of the three sides associated with the vertex 1 is {1, 2, 3}, those sides also have numbers of 1, 2, and 3 in a set of the total six sides as illustrated in FIG. 3. That is, $\varphi_1((1, 2, 3))=(1, 2, 3)$. Accordingly, the parity check matrix $H_1$, which is a matrix of 2×3, is copied onto the first column to the third column of the matrix $H_1$(bar) which is an expanded matrix of 2×6. The other components of $H_1$(bar) are zero. Further, when a set of the three sides associated with the vertex 2 is {1, 2, 3}, those sides have numbers of 4, 5, and 6 in the set of the total six sides as illustrated in FIG. 3. That is, $\varphi_2((1, 2, 3))=(4, 5, 6)$. Accordingly, the parity check matrix $H_2$, which is a matrix of 2×3, is copied onto the fourth column to the sixth column of the matrix $H_2$(bar) which is an expanded matrix of 2×6. The other components of $H_1$(bar) are zero.

Incidentally, the parity check matrix illustrated in FIG. 4 is an example, and a parity check matrix associated with each component code is not limited to such an example. Further, in a case in which b is two or more, the parity check matrix that is associated with the vertexes 1 and 2 is a matrix of (3b−k)×3b, and an expanded matrix is the matrix of (3b−k)×3b.

Figures 5, 6:
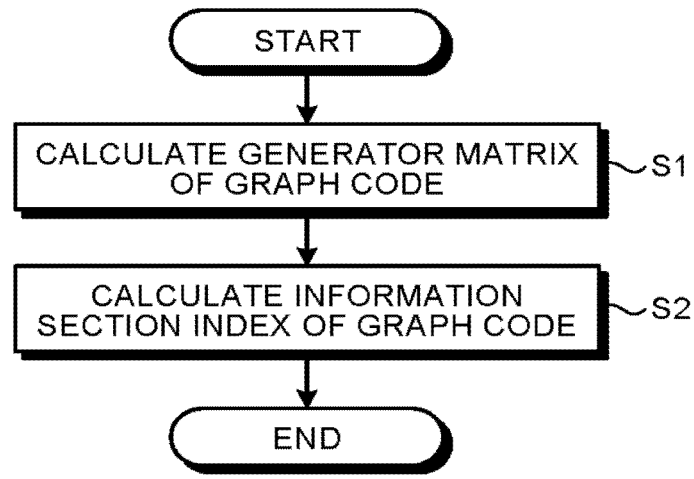
FIG. 5 is a diagram illustrating an example of a parity check matrix H' of a block graph code.
FIG. 6 is a diagram illustrating an example of a processing procedure that generates coding and decoding data of the first embodiment.

FIG. 5 is a diagram illustrating an example of a parity check matrix H' of the block graph code. FIG. 5 illustrates an example in which the parity check matrix H' of the block graph code is calculated using the expanded matrices $H_1$(bar) and $H_2$(bar) illustrated in FIG. 4 and expanded matrices $H_5$(bar), $H_6$(bar), and $H_7$(bar) calculated in the same manner regarding the vertexes 5, 6, and 7.

Hereinafter, the case of simply referring the graph code indicates the block graph code since the description is given by assuming the block graph code in the first embodiment.

When the parity check matrix of the graph code is defined in the above-described manner, it is possible to calculate the generator matrix of the graph code (the graph code generator matrix) using the parity check matrix. When the graph code generator matrix is set to G, the coding is performed by calculating c=uG with respect to the information vector u, and obtaining the vector c that represents the codeword. When S is a column-based transformation matrix to be obtained by composition of column replacement, the parity check matrix can be transformed to a form represented by the following Formula (4). Reference sign $I_{n-k}$ is a unit matrix of (n−k)×(n−k).

$$HS = (I_{n-k}, {}^t A) \quad (4)$$

A matrix A calculated by Formula (4) described above is used to obtain G' to be represented by the following Formula (5). Reference sign $I_k$ is a unit matrix of k×k.

$$G' := (A, I_k) \quad (5)$$

At this time, the following Formula (6) is established, and thus, G to be represented by the following Formula (7) is a generator matrix of the graph code C.

$$(G^{\kappa} S)^t H = G^{\kappa}(HS) = 0_{k, n-k} \quad (6)$$

$$G := G^{\kappa} S \quad (7)$$

Accordingly, the graph code generator matrix forming unit 261 can calculate the graph code generator matrix based on a component code parity check matrix, the block map, and the block size in the above-described manner.

Returning to the description of FIG. 2, the information section index calculation unit 262 illustrated in FIG. 2 performs the row-based transformation on the graph code generator matrix G to obtain the row-reduced echelon matrix, calculates the graph code information section index, which indicates the non-zero starting position of each row of the row-reduced echelon matrix, and associates the number indicating the row with the graph code information section index, and then, stores the information section index data in the storage unit 264 as the information section index data. In the first embodiment, the calculation time for the decoding is shortened by using the information section index data at the time of decoding as described above.

The coding unit 263 codes the graph code generator matrix stored in the storage unit 264, and the information, which is the user data, to be input from the data buffer 25 and generates the codeword of the graph code. The codeword of the graph code is stored in the non-volatile memory 3 via the memory I/F 22. Incidentally, the codeword of the graph code may be stored in a single page of the non-volatile memory 3, or may be stored across the plurality of pages of the non-volatile memory 3. Further, the plurality of codewords of the graph code may be stored in a single page of the non-volatile memory 3.

As described above, although the component code is assumed to be the systematic code, the respective component codes may be different from one another. For example, the respective component codes may have different code lengths. Accordingly, it is possible to flexibly change the code length of the codeword of the graph code. Further, it is possible to differentiate the error correction performance using the component code.

FIG. 6 is a diagram illustrating an example of a processing procedure that generates coding and decoding data of the first embodiment. Each process in the graph code generator matrix forming unit 261 and the information section index calculation unit 262 of the coding processor 26 illustrated in FIG. 2 is the process to be executed prior to performing coding and decoding. That is, the process in the graph code generator matrix forming unit 261 and the information section index calculation unit 262 is the process to generate coding and decoding data.

As illustrated in FIG. 6, first, the graph code generator matrix forming unit 261 calculates the generator matrix of the graph code (the graph code generator matrix) (Step S1).

The graph code generator matrix forming unit 261 stores the calculated generator matrix in the storage unit 264. Next, the information section index calculation unit 262 calculates the information section index of the graph code (the graph code information section index) (Step S2). The information section index calculation unit 262 associates the number indicating the row with the graph code information section index, and then, stores the information section index data in the storage unit 264 as the information section index data.

Figure 7:
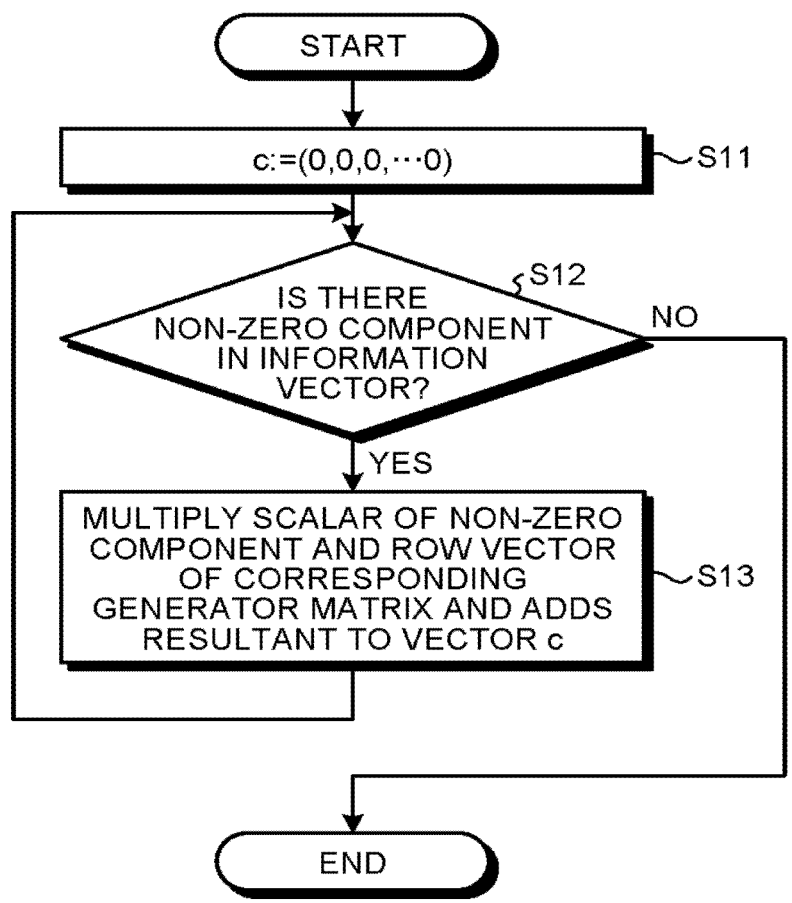
FIG. 7 is a diagram illustrating an example of a coding procedure of the first embodiment.

The processes described above may be performed at once after the graph code is determined. Thereafter, the coding unit 263 executes coding. FIG. 7 is a diagram illustrating an example of a coding procedure of the first embodiment. First, the coding unit 263 initializes the entire component of the codeword the vector c to zero (Step S11). Next, the coding unit 263 determines whether there is a non-zero component in the information vector, that is, the user data as an object to be coded (Step S12). In a case in which there is no non-zero component (Step S12 No), that is, the entire information vector is zero, the processing is ended.

In a case in which there is a non-zero component in the information vector (Step S12 Yes), the coding unit 263 multiplies a scalar of the non-zero component and an associated row vector of the generator matrix (the graph code generator matrix), adds the resultant to c (Step S13), and then, returns to Step S12. To be specific, the coding unit 263 multiplies the scalar of the non-zero component and the row vector of the graph code generator matrix, which is associated with one of the non-zero components of the information vector, and adds the resultant to c. Further, returning to Step S12, the coding unit 263 executes the processes of Step 12 and the subsequent steps regarding components excluding the processed component (after being subjected to the process in Step S13) of the information vector. According to the processes as described above, the codeword of the graph code is generated.

Next, decoding of the first embodiment will be described. In general, the decoding of the error correction code is performed in two stages of conversion from the received word to the codeword and conversion from the codeword to the information. In the graph code, serial decoding that sequentially decodes each component code for each vertex, similar to the product code, can be used for the conversion from the received word to the codeword. Further, the iterative decoding that repeatedly performs the serial decoding can be used. Although the block size and the block map can be used in the conversion from the received word to the codeword in order to grasp the received word in association with the component code even in a case in which the component-code intersection is blocked in the graph code, features other than such a point are the same as those of the typical graph code. Incidentally, there is no restriction in a decoding order of the component code, and it is possible to perform the decoding in an arbitrary sequence. In the first embodiment, a description will be given with an example in which an exemplary sequence for performing the decoding of the component code is defined in advance, then stored as a decoding order list, and the decoding of the component code is performed according to the decoding order list.

Regarding the conversion from the codeword to the information, it is possible to easily perform conversion to the information if the codeword is the systematic code, but labor is required since the graph code is typically a non-systematic code. There is a technique of using inverse mapping of coding as an example of techniques of converting the codeword of the non-systematic code to the information, but such a technique leads increase in the calculation amount.

Thus, the graph code information section index described above is used in the first embodiment, and accordingly, it is possible to convert the codeword to the information only by reading the symbol in association with the graph code information section index.

Figure 8:
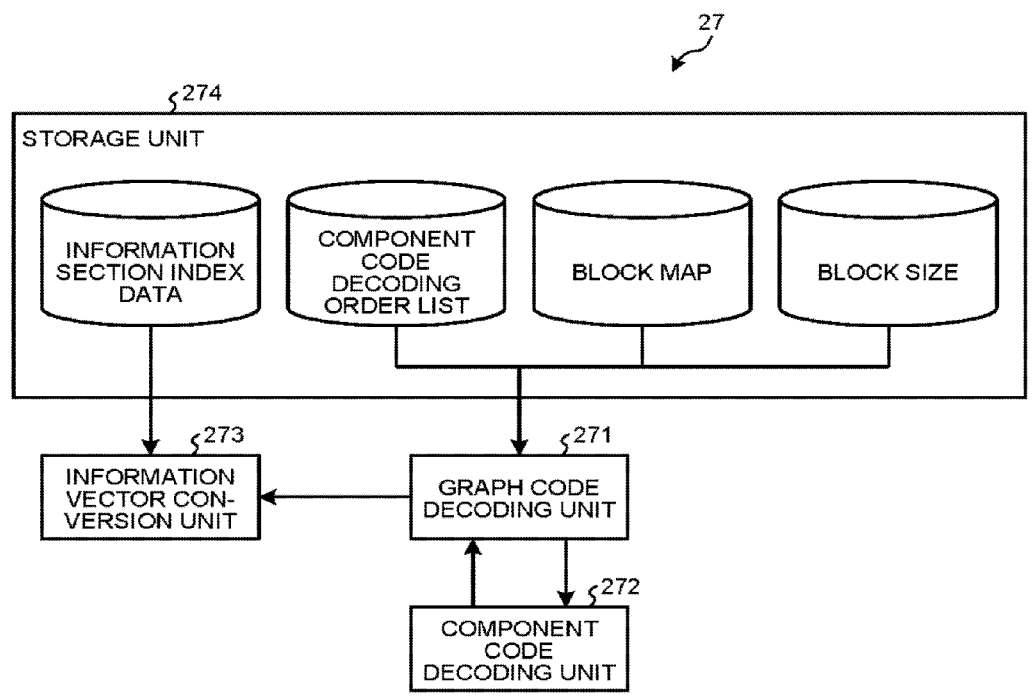
FIG. 8 is a diagram illustrating a configuration example of a decoding processor of the first embodiment.

FIG. 8 is a diagram illustrating a configuration example of the decoding processor 27 of the first embodiment. As illustrated in FIG. 8, the decoding processor 27 is provided with a graph code decoding unit 271, a component code decoding unit 272, an information vector conversion unit 273 and a storage unit 274. A block size, a block map, a component code decoding order list, and an information section index data are stored in advance in the storage unit 274. The block size and the block map are data determined at the time of defining the graph code, and are the same as the block size and the block map used in the coding as described above. The information section index data is data to be generated in the process of generating the coding and decoding data as described above. Since the data to be stored in the storage unit 274 includes the same data to be stored in the storage unit 264 of the coding processor 26 in this manner, the same data as the data to be stored in the storage unit 264 is copied onto the storage unit 274 in a case in which the storage unit 274 is provided as a different unit from the storage unit 264. Alternatively, a single storage unit may be configured by sharing the storage unit 274 with the storage unit 264 of the coding processor 26 so that the copy of the data is unnecessary.

The graph code decoding unit 271 extracts a received word (second received word) in association with the component code, based on the block map and the block size to be stored in the storage unit 274, from a received word (first received word) in association with the codeword of the graph code read from the non-volatile memory 3. Further, the graph code decoding unit 271 inputs each received word in association with each component code in the component code decoding unit 272 in the sequence according to the component code decoding order list stored in the storage unit 274. Incidentally, in a case in which the respective component codes are different codes, the decoding processor 27 is provided with a component code decoding unit for each component code, and the graph code decoding unit 271 inputs each received word in association with each component code in the corresponding component code decoding unit.

The component code decoding unit 272 decodes the input received word (received word of the component code), and passes the resultant to the graph code decoding unit 271. A decoding method of the component code may use any decoding method, and, for example, a minimum distance decoding method can be used. The graph code decoding unit 271 generates a codeword of the graph code based on a result of the decoding each received word in association with the component code, and passes the codeword of the graph code to the information vector conversion unit 273. Incidentally, the graph code decoding unit 271 may perform the iterative decoding by further inputting the decoded result of each received word in association with the component code to the component code decoding unit 272.

The information vector conversion unit 273 converts the codeword of the graph code to the information vector, that is, the original user data using the information section index data to be stored in the storage unit 274. In this manner, the user data is restored. The restored user data is transmitted to the host via the host I/F 21 by the control unit 23.

Figure 9:
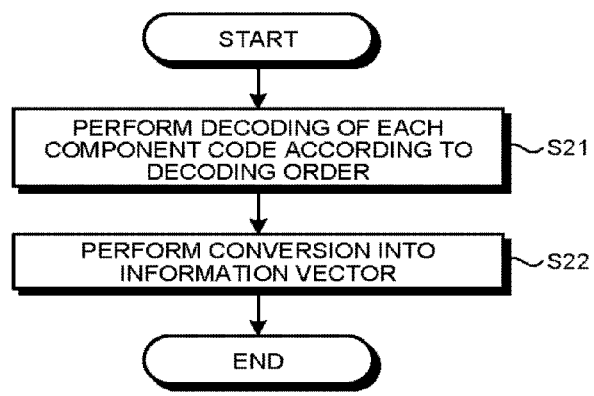
FIG. 9 is a flowchart illustrating an example of a decoding procedure of a graph code according to the decoding processor of the first embodiment.

FIG. 9 is a flowchart illustrating an example of the decoding procedure of the graph code according to the decoding processor 27 of the first embodiment. First, the graph code decoding unit 271 and the component code decoding unit 272 perform decoding of each component code according to the decoding order defined by the component code decoding order list (Step S21). Next, the information vector conversion unit 273 converts the codeword of the graph code obtained by decoding the component code to the information vector using the information section index data (Step S22).

Incidentally, the description has been given regarding the example in which the graph code generator matrix forming unit 261 and the information section index calculation unit 262 that perform the process of generating the coding and decoding data are provided in the coding processor 26 in the above description. Meanwhile, it is enough that the process of generating the coding and decoding data is performed prior to the coding and decoding as described above, and thus, the graph code generator matrix forming unit 261 and the information section index calculation unit 262 may be configured as a different calculation data generating unit from the coding processor 26.

The above-described calculation data generating unit can be provided in an arbitrary location in the memory controller 2. The calculation data generating unit is provided with the graph code generator matrix forming unit 261, the information section index calculation unit 262 and a storage unit, and the coding processor 26 is not provided with the graph code generator matrix forming unit 261 and the information section index calculation unit 262. The block map and the block size are stored in advance in the storage unit of the calculation data generating unit, and the graph code generator matrix and the information section index data generated by the graph code generator matrix forming unit 261 and the information section index calculation unit 262 are stored in the storage unit. Further, the graph code generator matrix stored in the storage unit is copied onto the storage unit 264 of the coding processor 26. Accordingly, the coding processor 26 serves as the coding arithmetic unit 300 illustrated in FIG. 2 in such a case. That is, the coding processor 26 is configured of the coding unit 263 and the storage unit 264, and the graph code generator matrix is stored in the storage unit 264.

Figure 10:
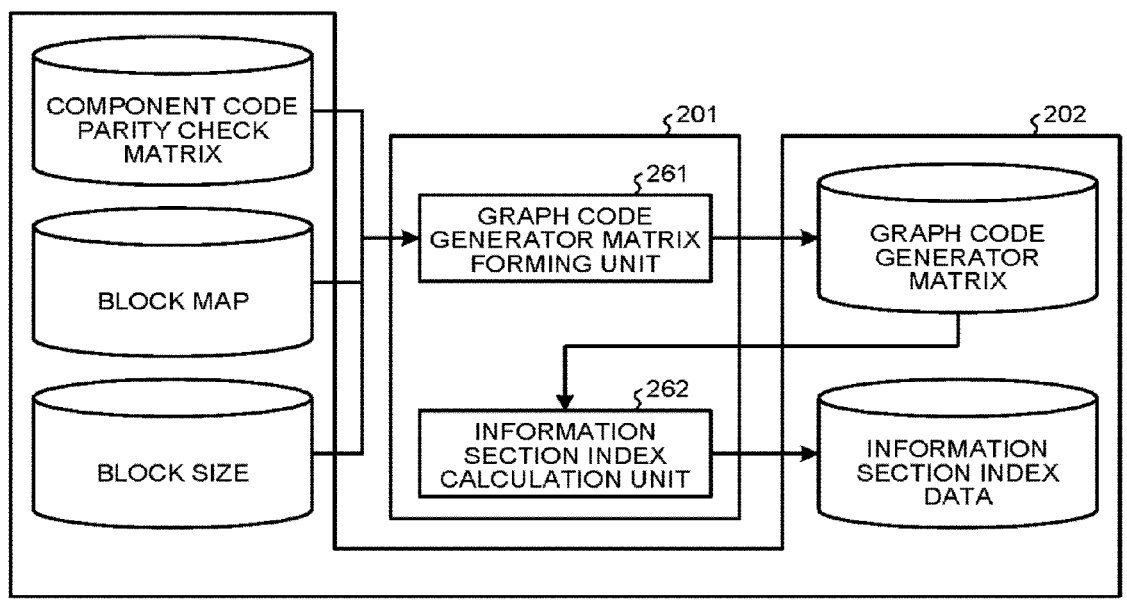
FIG. 10 is a diagram illustrating a configuration example of a calculation data generating unit in a case in which the calculation data generating unit is provide outside the memory system.

In addition, the calculation data generating unit may be provided outside the memory system 1. For example, the calculation data generating unit may be realized using an information processing device such as a computer. FIG. 10 is a diagram illustrating a configuration example of the calculation data generating unit in a case in which the calculation data generating unit is provide outside the memory system 1. The calculation data generating unit is provided with a control unit 201 and a storage unit 202. The control unit 201 is a CPU and the like of the information processing device, and the storage unit 202 is a memory. The graph code generator matrix forming unit 261 and the information section index calculation unit 262 are realized by the control unit 201. In such a case, each operation of the graph code generator matrix forming unit 261 and the information section index calculation unit 262 is the same as that in the above-described example. The graph code generator matrix of the storage unit 202 is copied onto the storage unit 264 of the coding processor 26. Further, the block map, the block size, and the information section index data of the storage unit 202 are copied onto the storage unit 274 of the decoding processor 27.

As above, the component-code intersection has been blocked in the graph code in the first embodiment. Thus, it is possible to increase the code length of the component code by suppressing the increase of the code length of the entire graph code. Further, the graph code generator matrix is subjected to row-based transformation to obtain the row-reduced echelon matrix, the index that indicates the non-zero starting position of each row of the row-reduced echelon matrix is calculated and saved so as to be used in the decoding. Thus, it is possible to suppress the calculation amount of the decoding process.

Second Embodiment

Figure 11:
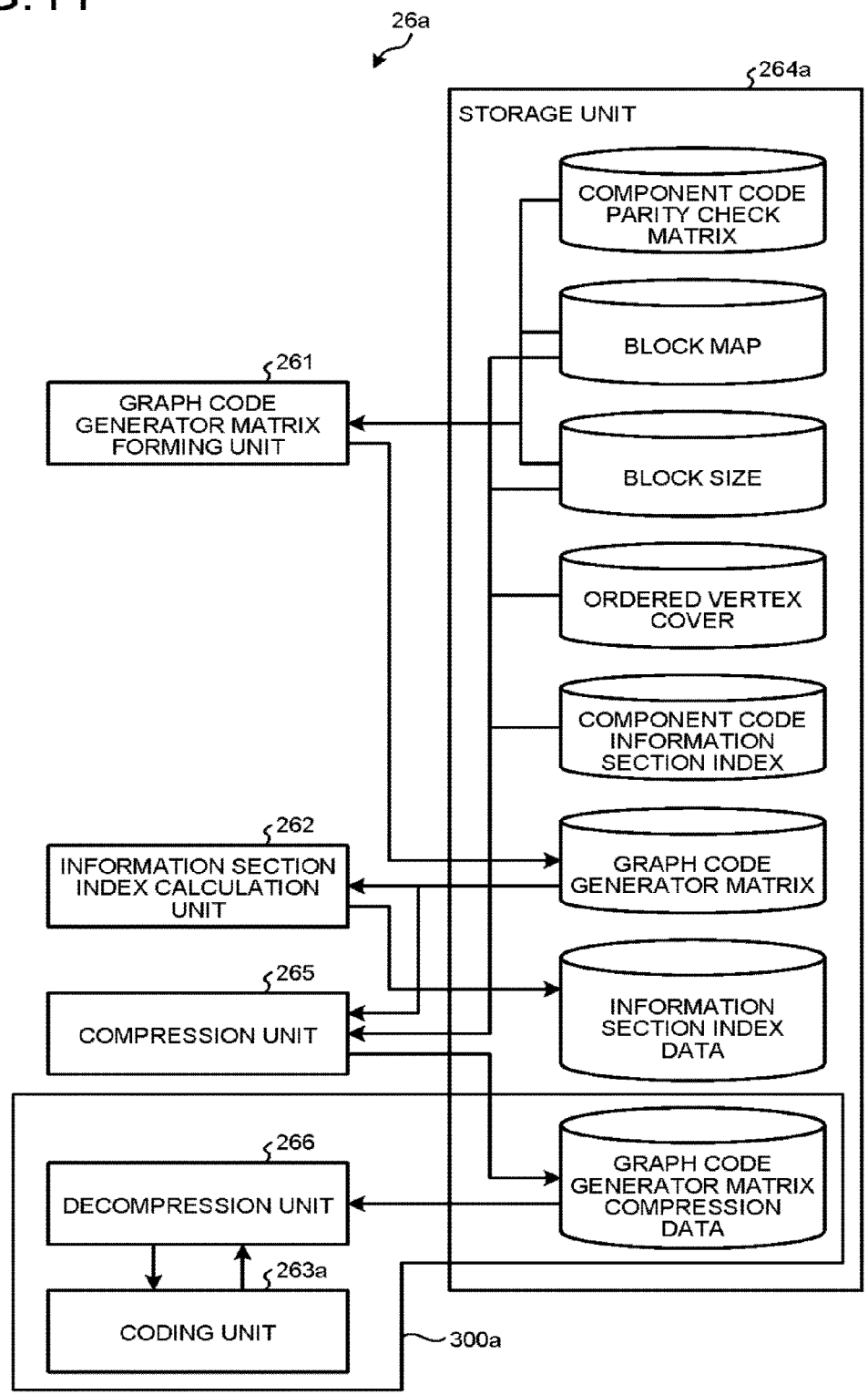
FIG. 11 is a diagram illustrating a configuration example of a coding processor of a second embodiment.

FIG. 11 is a diagram illustrating a configuration example of a coding processor of a second embodiment; A configuration of a memory system of the second embodiment is the same as the configuration of the memory system of the first embodiment except that a coding processor 26a is provided instead of the coding processor 26. Hereinafter, parts different from the first embodiment will be described.

The coding processor 26a is the same as the coding processor 26 of the first embodiment except that a compression unit 265 and a decompression unit 266 are added to the coding processor 26 of the first embodiment, and the storage unit 264 is replaced with a storage unit 264a. Similar to the storage unit 264 of the first embodiment, the block size and the block map, and further, a component code information section index and an ordered vertex cover are also stored in advance are stored in advance in the storage unit 264a. Further, the graph code generator matrix generated by the graph code generator matrix forming unit 261 is also stored in the storage unit 264a similar to the first embodiment. Incidentally, graph code generator matrix compressed data, which is the data obtained by compressing the graph code generator matrix, is also stored in the storage unit 264a in the second embodiment as will be described later. The graph code generator matrix may be erased after the graph code generator matrix compressed data is stored.

A coding arithmetic unit 300a illustrated in FIG. 11 represents a part to be used in the case of performing coding of the graph code after the graph code generator matrix or the like is generated.

The description has been given regarding the example of blocking the component-code intersection using the graph code in the first embodiment. Since the amount of coding is long in the graph code, a size of the generator matrix also increases, and the arithmetic amount of coding using the generator matrix increases. In the second embodiment, the generator matrix is compressed prior to the coding to reduce the arithmetic amount of the coding. Further, it may be enough when only the compressed generator matrix is saved and the original generator matrix may not be necessarily used after the generator matrix is compressed, and thus, it is also possible to reduce the memory area for saving the generator matrix.

Figure 12:
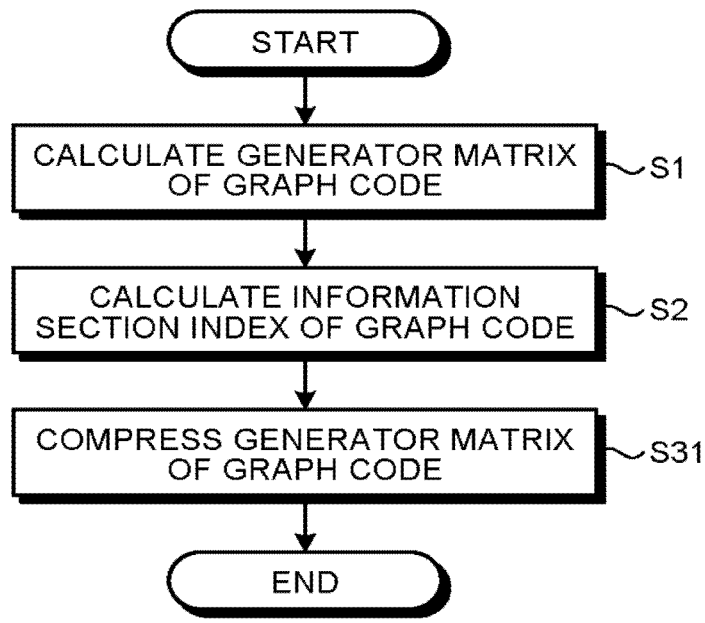
FIG. 12 is a diagram illustrating an example of a processing procedure that generates coding and decoding data of the second embodiment.

FIG. 12 is a diagram illustrating an example of a processing procedure that generates coding and decoding data of the second embodiment. Each process in the graph code generator matrix forming unit 261, the information section index calculation unit 262 and the compression unit 265 of the coding processor 26a illustrated in FIG. 11 is the process to be executed prior to performing coding and decoding. That is, the process in the information section index calculation unit 262 and the compression unit 265 is the process to generate the coding and decoding.

Steps S1 and Step S2 illustrated in FIG. 12 are the same as those in the first embodiment. In the second embodiment, the compression unit 265 compresses the graph code generator matrix (Step S31) after Step S2.

A description will be given regarding an overview of the compression of the graph code generator matrix according to the second embodiment. A row vector of the i-th row of the graph code generator matrix is configures of codewords of component codes regarding for each vertex. That is, the row vector of the i-th row of the graph code generator matrix is configured by combining the plurality of codewords in association with the component codes. Thus, sequential coding is performed in unit of the component code so that it is not necessary to save a component in association with a component code in the graph code generator matrix. Further, a component which has been already stored as an information section or a parity of another component code is not saved. In this manner, the graph code generator matrix is compressed by saving only a necessary part in the second embodiment.

That is, the compression unit 265 first saves a part in association with an information section of a component code of the vertex 1 of the graph code generator matrix in the storage unit 264a. A part in association with a parity of the component code of the vertex 1 of the graph code generator matrix is not saved since it is possible to generate the part by coding the information section of the component code of the vertex 1 (coding of the component code) at the time of being used in the coding of the graph coding. Next, the compression unit 265 saves a part which has not been saved so far (the part that is not overlapped with the information section index of the component code of the vertex 1) among parts in association with an information section of a component ode of the vertex 2 of the graph code generator matrix in the storage unit 264a. A part in association with a parity of the component code of the vertex 2 of the graph code generator matrix is not saved since it is possible to generate the part by coding the information section of the component code of the vertex 2. As above, the data is generated by adding data obtained by excluding data, which has been already determined to be included (saved) in the compressed data among data in association with the information section of the component code for each component code associated with the vertex in the graph code generator matrix, to sequentially compressed data in the second embodiment.

In the above-described compression process, any part set as an object to be saved of the graph code generator matrix (that is, a part which is not set as the object to be saved yet in the information section of the component code of each vertex) can be determined based on the block map, which is the connection information indicating the connection relationship for each vertex in the graph code, the component code information section index that indicates the information section of the component code in association with the vertex, and the ordered vertex cover, to be described later, which is the sequence information of the vertexes to be set as an object to be processed.

Next, the compression unit 265 saves a part that has not been saved so far among the parts in association with the information section of the component code of the vertex 3 of the graph code generator matrix (the part that is not overlapped with the information section indexes of the component codes of the vertex 1 and the vertex 2) in the storage unit 264a. A part in association with a parity of the component code of the vertex 3 of the graph code generator matrix can be generated by coding the information section of the component code of the vertex 3, and thus, is not saved. When the above-described processing is performed for the entire vertex, the part that has not been saved yet of the part in association with the information section of the component code of each vertex in the graph code generator matrix is saved as the compressed generator matrix. Further, a compression index, which is an index indicating any side of any vertex with which the save part is associated, for each row, and the saved part of the generator matrix are associated with one another, and then, is stored in the storage unit 264a as the compressed data of the generator matrix. Any sequence in which the storing of the information section is performed during the compression regarding the respective component codes, that is, the respective vertexes is defined by, for example, an ordered vertex cover $V'=(v_1, v_2, \ldots, v_1)$. A vertex cover is a set of vertexes that sufficiently cover each side, and the ordered vertex cover is obtained by defining a sequence to each vertex of the vertex cover.

At the time of using the graph code generator matrix, that is, at the time of coding the graph code, it is possible to decompress the compressed generator matrix, that is, restore the original graph generator matrix by performing the sequential coding that includes coding of a component in association with the information section of the component code of the $v_1$, that is, vertex 1 (coding of the component code) to generate a parity, and then, coding of a component in association with the information section of the component code of the $v_2$, that is, the vertex 2 to generate a parity using the compressed generator matrix. Incidentally, at the time of the compression, the above-described compression is performed for each row of the graph code generator matrix, and the compressed data is saved for each row. Further, at the time of the decompression, the decompression unit 266 may perform the decompression as much as a row required for coding of the graph code, that is, the row in association with the part of which the information vector is not zero, in the graph code generator matrix compressed data based on the information vector.

Next, a description will be given regarding an exemplary process of the second embodiment with reference to a specific example of using a full tripartite graph code as one of full M-partite graph codes. Reference sign M indicates an integer of two or more. A bipartite graph represents a graph which can be set such that there is no side between two arbitrary vertexes in each set when a vertex set of a graph is divided into two non-empty subsets. Similarly, an M-partite graph represents a graph which can be set such that there is no side between two arbitrary vertexes in each set when a vertex set is divided into M non-empty subsets. A full M-partite graph is a graph in which there is no side between two arbitrary vertexes in each set when a vertex set is divided into M non-empty subsets, further, the subsets have no common part, and the sum of the subsets becomes the entire set.

Figure 13:
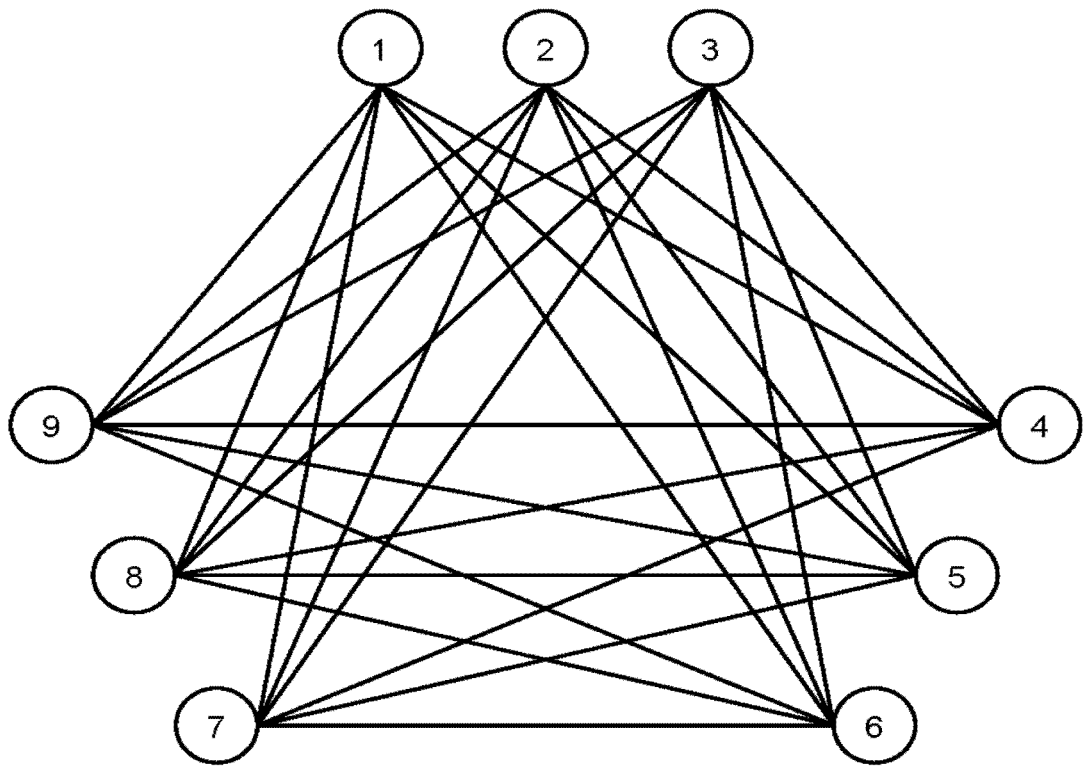
FIG. 13 is a diagram illustrating an example of a full tripartite graph.

FIG. 13 is a diagram illustrating an example of the full tripartite graph. In FIG. 13, when vertexes of the vertex 1 to the vertex 9 are divided into a subset of the vertexes 1, 2, and 3, a subset of the vertexes 4, 5, and 6, and a subset of the vertexes 7, 8, and 9, there is no side between arbitrary two vertexes in each set, there is no common part between the subsets, and the sum of the subsets become the entire set.

The compression of the graph generator matrix described above can be applied to an arbitrary graph code including any graph code which is not blocked. In the case of performing the compression, only a component of the row vector of the i-th row of the graph generator matrix which becomes non-zero in the compression index is collected and the number of the components is set to $K_g$. In a case in which there are many zero-components in the row vector, it is possible to enhance efficiency of compression by setting a combination of an index indicating a non-zero position, and a value of the non-zero component as the compression index and the like as will be described later. Accordingly, it is possible to perform additional compression using an ordered vertex cover V' that allows $\Sigma K_g$ to be minimized. However, it is also difficult to obtain the vertex cover in a general graph, and it is difficult to use the ordered vertex cover V' that allows $\Sigma K_g$ to be minimized. On the other hand, in a case in which a characteristic of a graph is apparent like the full M-partite graph, it is possible to enhance an effect of the data compression only using the obvious vertex cover.

Figure 14:
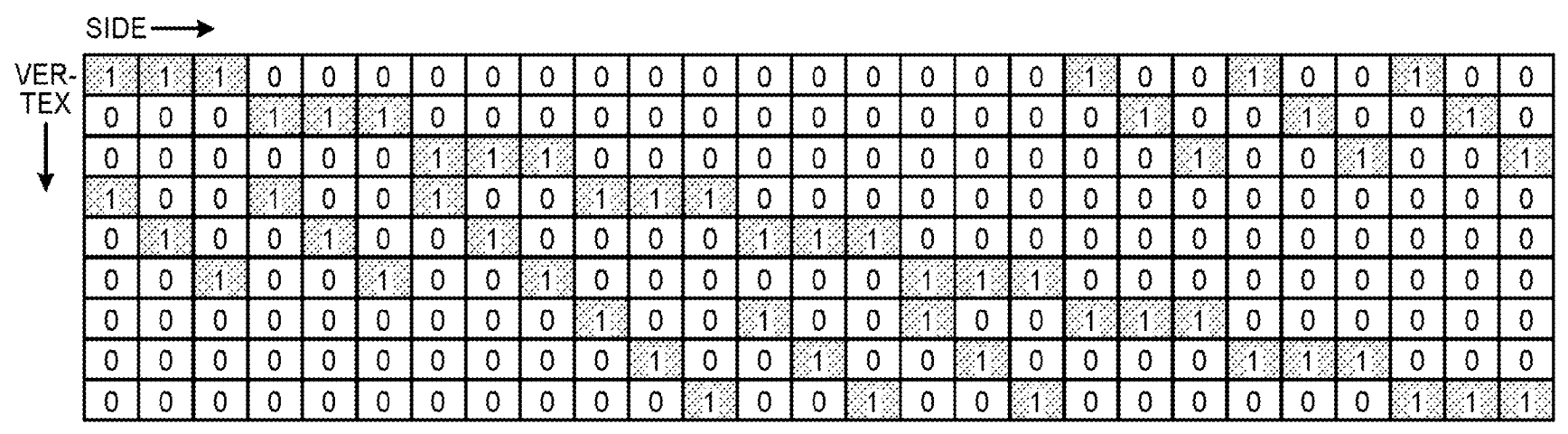

Returning to the description of FIG. 13, a graph code of using the full tripartite graph illustrated in FIG. 13 is considered. Here, a description will be given regarding an example in which a size of a block b is 1 in order to simplify the description. FIG. 14 is a diagram illustrating a connection matrix of the graph illustrated in FIG. 13.

The connection matrix is a matrix of V×E in which each row is associated with each vertex, and each column is associated with each side when the number of vertexes of the graph is V, and the number of sides is E. When an element of an e-th column of a v-th row of the connection matrix is set to $s_{v,e}$, $s_{v,e}=1$ when the v-th vertex is connected to the e-th side, and $s_{v,e}=0$ when the v-th vertex is not connected to the e-th side. The block size is a size of the block of the component-code intersection.

As illustrated in FIG. 14, number of sides of the graph are set such that the sides directed respectively to the vertexes 4, 5, and 6 from the vertex 1 illustrated in FIG. 13 are set to 1, 2, and 3, the sides directed respectively to the vertexes 4, 5, and 6 from the vertex 2 are set to 4, 5, and 6, and the sides directed respectively to the vertexes 4, 5, and 6 from the vertex 3 are set to 7, 8, and 9. Further, the sides directed respectively to the vertexes 7, 8, and 9 from the vertex 4 are set to 10, 11, and 12, the sides directed respectively to the vertexes 7, 8, and 9 from the vertex 5 are set to 13, 14, and 15, and the sides directed respectively to the vertexes 7, 8, and 9 from the vertex 6 are set to 16, 17, and 18. Further, the sides directed respectively to the vertexes 1, 2, and 3 from the vertex 7 are set to 19, 20, and 21, the sides directed respectively to the vertexes 1, 2, and 3 from the vertex 8 are set to 22, 23, and 24, and the sides directed respectively to the vertexes 1, 2, and 3 from the vertex 9 are set to 25, 26, and 27.

FIG. 15 is a diagram illustrating an example of the parity check matrix of the component code. FIG. 16 is a diagram illustrating an example of the generator matrix of the component code that is associated with the parity check matrix illustrated in FIG. 15. Here, each component code is set to be expressed by the generator matrix of the same component code.

FIG. 17 is a diagram illustrating an example of the block map that is associated with the graph illustrated in FIG. 13. As illustrated in FIG. 17, the six sides to which the respective vertexes are connected are associated with the numbers of the sides attached in the graph code as illustrated in the right side of FIG. 17.

Figure 18:
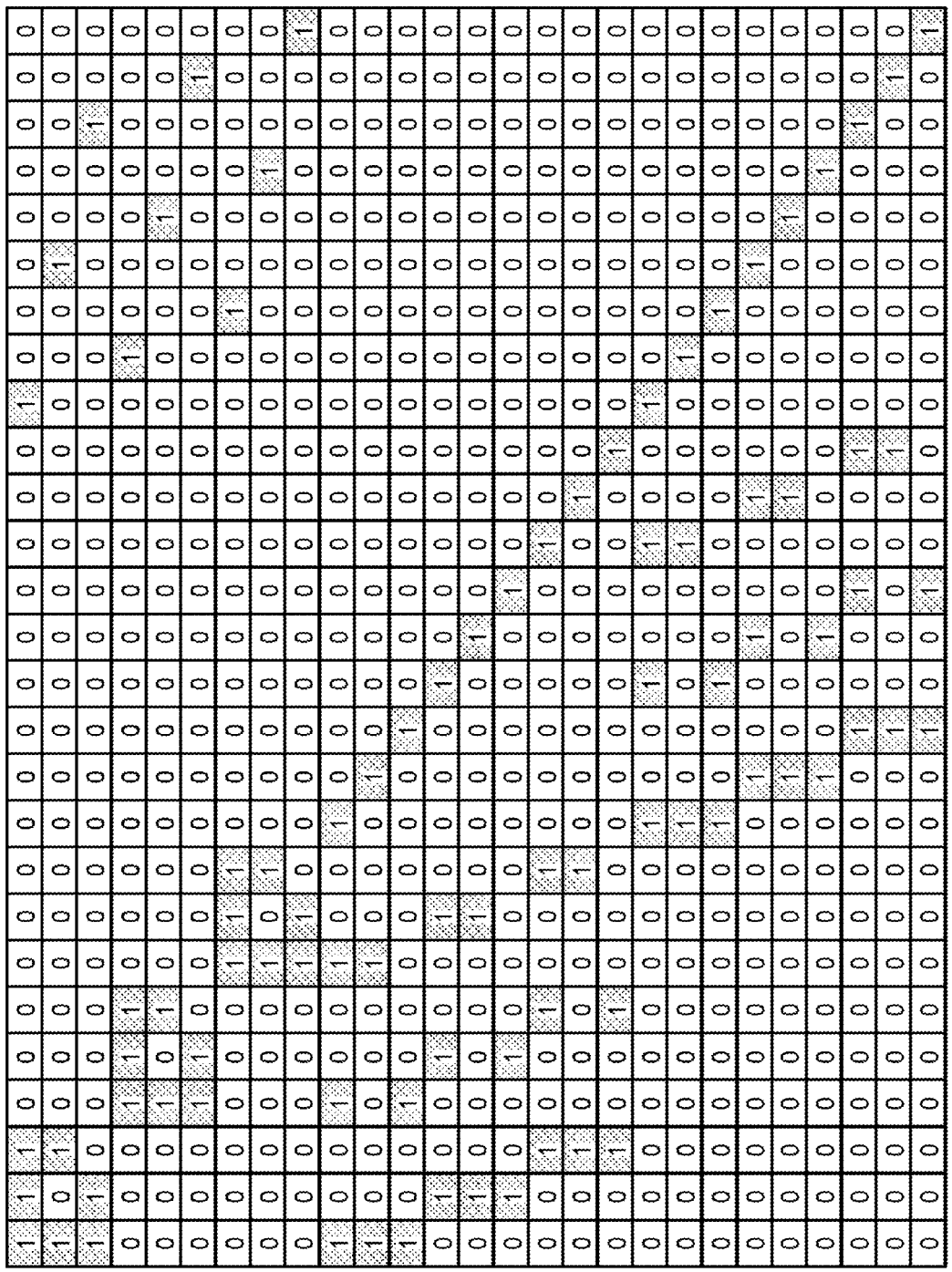
FIG. 18 is a diagram illustrating a parity check matrix of a graph code assuming FIGS. 13 to 17.
Figure 19:
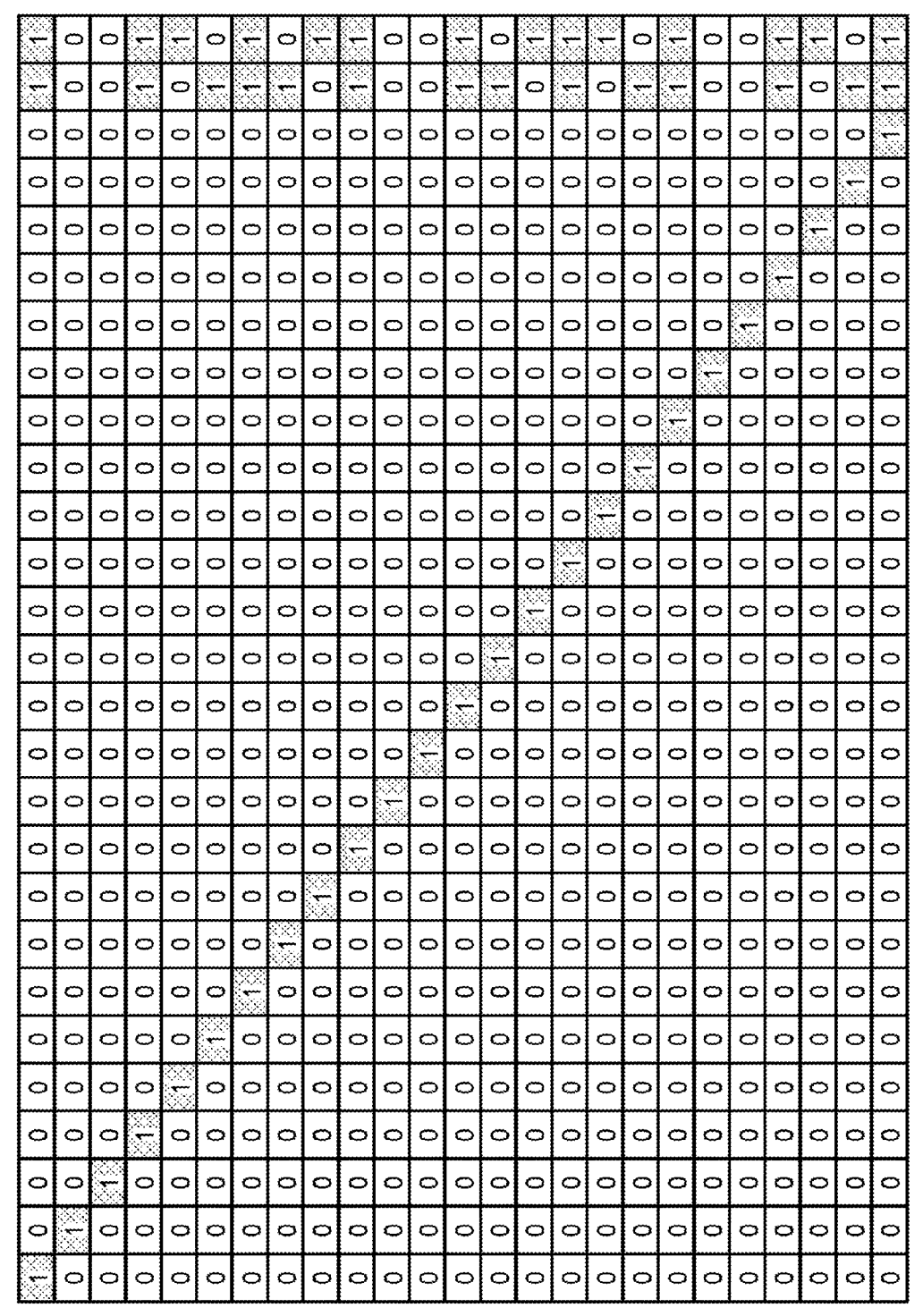

FIG. 18 is a diagram illustrating the parity check matrix of the graph code assuming FIGS. 13 to 17. A method of generating the parity check matrix is the same as described in the first embodiment. Incidentally, any component that becomes the zero row vector according to the linear dependency is removed from the parity check matrix. FIG. 19 is a diagram illustrating the parity check matrix after erasing an element that becomes a zero row vector according to linear dependency; The parity check matrix can be transformed into the form of Formula (4) as described above. Further, it is possible to calculate the generator matrix using Formulas (5) to (7).

Figure 20:
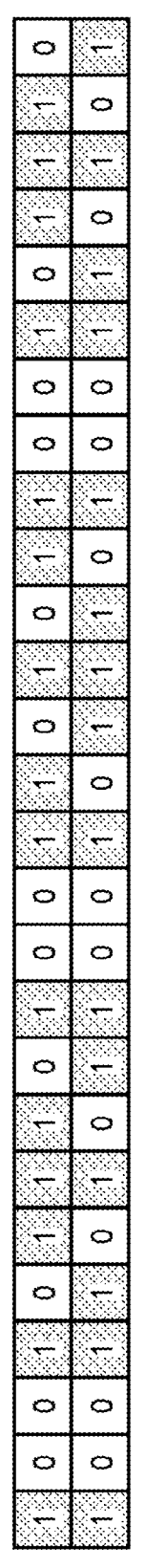

FIG. 20 is a diagram illustrating the graph code generator matrix calculated using the parity check matrix illustrated in FIG. 19. FIG. 21 is a diagram illustrating the row-reduced echelon matrix transformed from the graph code generator matrix illustrated in FIG. 20. As described in the first embodiment, the information section index that indicates the non-zero starting position of each row is calculated using the generator matrix transformed into the row-reduced echelon matrix as illustrated in FIG. 21. The information section index is an index, which is an initial non-zero component of each row of the generator matrix transformed into the row-reduced echelon matrix (the component of 1 in the example of FIG. 21), that is, a column number. Since the first column is initially 1 in the first row, and the fifth column is initially 1 in the second row in the example of FIG. 21, the information section index data is (1,5).

Next, a description will be given regarding a specific example of the compression of the generator matrix with reference to the examples illustrated in FIGS. 13 to 21. In the graphs illustrated in FIGS. 13 and 14, the ordered vertex cover is set to (1, 2, 3, 4, 5, 6). Further, in a case in which the generator matrix of the component code illustrated in FIG. 16 is used, the component code information section index is (1, 2, 3). As described above, the ordered vertex cover and the component code information section index are stored in advance in the storage unit 264a. Here, the same component code is set to be used for the entire vertex. In this case, the component code information section index is (1, 2, 3) for the entire vertex. That is, when the six sides to which respective vertexes are connected are set to 1, 2, 3, 4, 5, and 6, the sides 1, 2, and 3 are associated with the information section of the codeword of the component code, and the sides 4, 5, and 6 are associated with the parity of the codeword of the component code. As described above, since the component code may be different for each vertex, the component code information section index is stored for each vertex in the storage unit 264a.

The compression unit 265 can calculate numbers in the entire graph of a side in association with the information section of the codeword of the component code among the sides in association with the respective vertexes using the component code information section index and the block map stored for the respective vertexes in the storage unit 264a. The compression unit 265 obtains an index that indicates the part to be saved in association with each vertex in the graph code generator matrix according to the sequence of the ordered vertex cover referring to the ordered vertex cover.

In this example, the compression unit 265 first calculates (1, 2, 3) as numbers in the entire graph of a side in association with the information section of the codeword of the component code for the vertex 1 which is the first vertex to be represented as the ordered vertex cover using the component code information section index and the block map. Next, the compression unit 265 calculates (4, 5, 6) as numbers in the entire graph of a side in association with the information section of the codeword of the component code for the vertex 2 which is the second vertex to be represented as the ordered vertex cover using the component code information section index and the block map. Similarly, (7, 8, 9) is calculated as numbers in the entire graph of a side in association with the information section of the codeword of the component code for the vertex 3, (1, 4, 7) is calculated as numbers in the entire graph of a side in association with the information section of the codeword of the component code for the vertex 4, (2, 5, 8) is calculated as numbers in the entire graph of a side in association with the information section of the codeword of the component code for the vertex 5, and (3, 6, 9) is calculated as numbers in the entire graph of a side in association with the information section of the codeword of the component code for the vertex 6.

When the calculation results from the vertex 1 to the vertex 6 are collected, and the overlapping numbers of the sides are removed, (1, 2, 3, 4, 5, 6, 7, 8, 9) is calculated as the compression index. The compression unit 265 extracts a part in association with this compression index for each row from the graph code generator matrix. A vector to be obtained by extracting the part in association with the compression index from the i-th row of the graph code generator matrix is set to $p_i$. In the example of the generator matrix illustrated in FIG. 21, a vector $p_1$ to be obtained by extracting the part in association with the compression index from the first row of the graph code generator matrix is $p_1$=(1, 0, 0, 1, 0, 1, 1, 1, 0). Similarly, a vector $p_2$ to be obtained by extracting the part in association with the compression index from the second row of the graph code generator matrix is $p_2$=(0, 0, 0, 0, 1, 1, 0, 1, 1). The compression unit 265 stores the compression index and $p_i$ in the storage unit 264a as the compressed data of the graph code.

Further, since there is also a case in which $p_i$ include a lot of zero, it is possible to further reduce the data size when saving data $p_i'$ of a set between the index of the non-zero component of $p_i$ and a value of the non-zero component instead of $p_i$. In the case of the above-described example, $p_1'$=((1,1), (1,4), (1,6), (1,7), (1,8)), and $p_2'$=((1,5), (1,6), (1,8), (1,9)). In the case of the binary code since the non-zero component is 1, only the index of non-zero component may be saved as $p_i''$. In the case of the above-described embodiment, $p_1''$=(1, 4, 6, 7, 8), and $p_2''$=(5, 6, 8, 9)).

Figure 22:
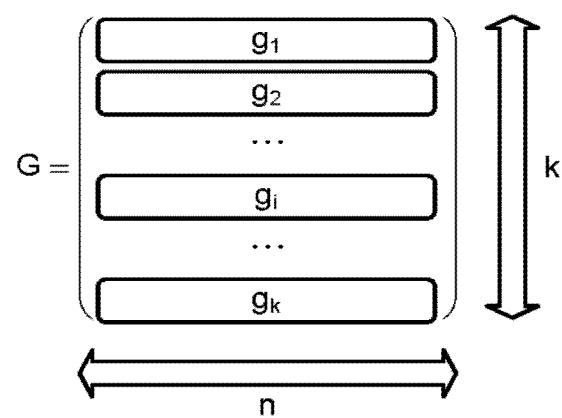
FIG. 22 is a diagram illustrating a generator matrix of the graph code.
Figure 23:
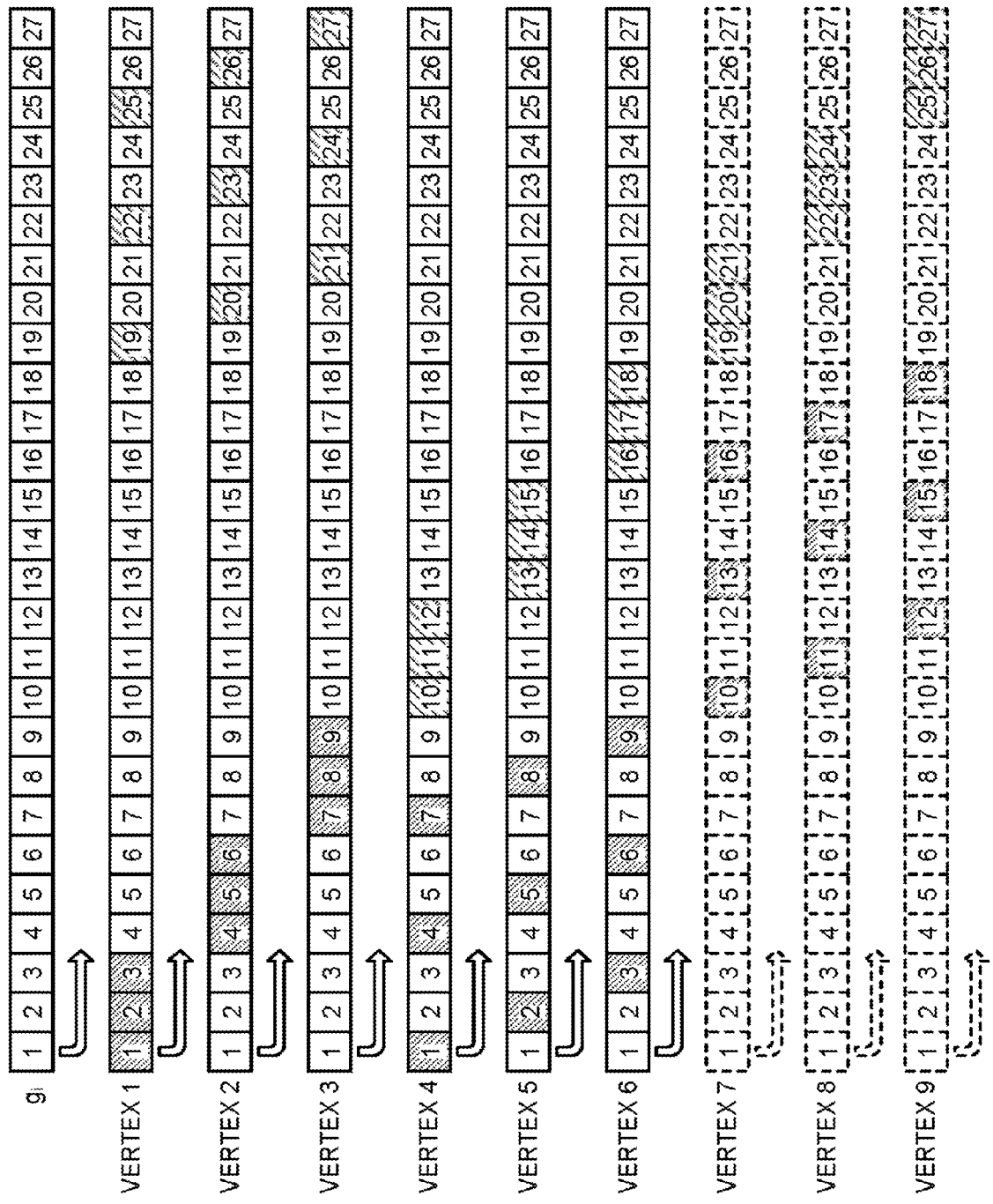
FIG. 23 is a diagram schematically illustrating compression of a row vector $g_i$.
Figure 24:
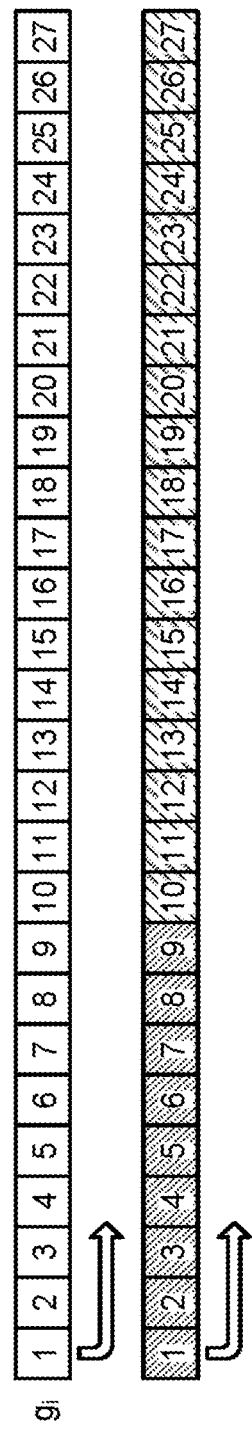
FIG. 24 is a diagram schematically illustrating compression of the row vector $g_i$.

Here, the compression of the graph code generator matrix of the second embodiment will schematically illustrated with reference to the drawings. When n is the code length, and k is a dimension, the generator matrix G of the graph code is a matrix of n×k and is configured of the row vectors $g_1$ to $g_k$ as illustrated in FIG. 22. The respective row vectors $g_1$ to $g_k$ may also be the codeword of the graph code. FIGS. 23 and 24 are diagrams schematically illustrating the compression of the row vector $g_i$ of the i-th row. The first row of FIG. 23 indicates the row vector $g_i$. In FIG. 23, each rectangle is associated with one symbol, that is, one side in this example. A numeral value of the rectangle is associated with the number indicating a side.

In FIG. 23, a part in association with the information section of the component code associated with each vertex is indicated by a thick hatching, and a part in association with the parity of the component code associated with each vertex is indicated by a thin hatching. The second row of FIG. 23 represents a codeword of the component code in association with the vertex 1, the part in association with the numbers 1, 2, and 3 is the information section, and the part in association with the numbers 19, 22, and 25 represents the parity. Similarly, the third row to the tenth row of FIG. 23 respectively represent the information section of the codeword of the component code and the parity of the vertexes 2 to 9. The information section of the codeword of the component code are selected as the object to be saved in the order from the vertex 1.

As described above, the part in association with the parity of the component code can be generated from the part in association with the information section of the component code, and thus, the part in association with the parity of the component code may not be saved. Since the numbers 1, 4, and 7 in association with the information section of the codeword of the component code are already selected as the object to be saved in the vertex 4, it is possible to calculate the part in association with the parity from the data already selected as the object to be saved. Similarly, the numbers in association with the information section of the codeword of the component code are already selected as the object to be saved regarding the vertexes 5 and 6, it is possible to calculate the part in association with the parity from the data already selected as the object to be saved. Further, the vertexes 7, 8, and 9 can generate the information section of the component code as the parity of the vertexes 1 to 6, and thus, there is no need for newly saving the information section of the component code of the vertexes 7, 8, and 9 either. Further, the vertexes 7, 8, and 9 can also generate the parity of the component code as the parity of the vertexes 1 to 6, and thus, there is no need for calculating the parity regarding the vertexes 7, 8, and 9 either. That is, there is no need for performing any process regarding the vertexes 7, 8, and 9, and thus, the vertexes 7, 8, and 9 are not necessarily included in the ordered vertex cover, and it is possible to set the ordered vertex cover to (1, 2, 3, 4, 5, 6) in the above-described example.

As described above, it may be enough when the part with the dark hatching of the second row is stored among the row vector $g_i$ illustrated in the first row of FIG. 24 as illustrated in FIG. 24. The data of the graph code generator matrix in association with the part with the dark hatching of the second row of FIG. 24 is the above-described $p_i$, and the number in association with the part with the dark hatching is the compression index.

Figure 25:
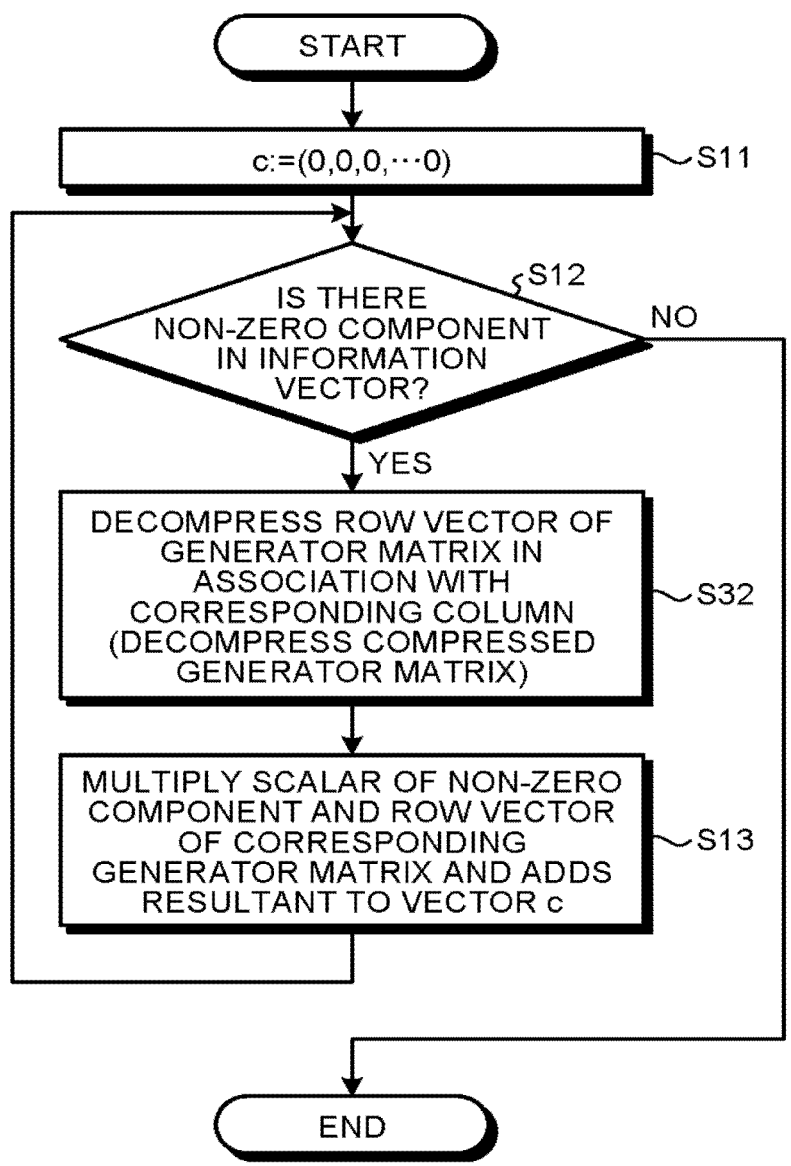
FIG. 25 is a flowchart illustrating an example of a coding processing procedure of the second embodiment.

Next, coding processing of the second embodiment will be described. FIG. 25 is a flowchart illustrating an example of a coding processing procedure of the second embodiment. Steps S11 and S12 are the same as in the first embodiment. In the case of Yes in Step S12, the coding unit 263*a* instruct the decompression unit 266 to decompress the row vector in association with a row with the non-zero component, and the decompression unit 266 decompresses the row vector in association with a column with the non-zero component (Step S32). To be specific, the decompression unit 266 reads data, associated with the row to be instructed from the coding unit 263*a* among the compressed data of the graph code generator matrix, from the storage unit 264*a*. In a case in which the compression index and $p_i$ are stored, the compression index and $p_i$ in association with the row to be instructed from the coding unit 263*a* are read. The decompression unit 266 decompresses $g_i$ using the ordered vertex cover, the compression index, and $p_i$.

The decompression will be described with reference to the examples illustrated from FIGS. 13 to 21. FIG. 26 is a diagram for describing the decompression of the row vector $g_i$. First, the decompression unit 266 prepares a vector a as a coding buffer. In a case in which the row vector $g_1$ of the first row is decompressed, the above-described compression index (1, 2, 3, 4, 5, 6, 7, 8, 9) and $p_1$=(1, 0, 0, 1, 0, 1, 1, 1, 0) are used. First, the parity is generated by performing coding of the component code with respect to (1, 0, 0) which is first, second and third components of $p_1$ based on the block map, the component code information section index, and the compression index first regarding the vertex 1, on the basis of the ordered vertex cover. Further, the decompression unit 266 understands that these parities are associated with the numbers 19, 22, and 25 based on the block map, and stores the generated parity at 19th, 22th and 25th position of the vector a. Further, the decompression unit 266 stores (1, 0, 0) which is first and second and third components of $p_1$ in first and second and third positions of the vector a. FIG. 26 illustrates the data to be stored in the vector a. The part hatched by dots in FIG. 26 represents a part in association with the information section, and the part to be hatched by crossing oblique lines in FIG. 26 represents a part in association with the parity.

Similarly, the decompression unit 266 stores the information section in the vector a for each vertex according to the sequence represented by the ordered vertex cover, generates the parity, and store the parity in the vector a. When the processing is performed even regarding the vertex 6, the row vector $g_1$ can be decompressed.

Incidentally, in a case in which $p_i'$ is stored as the compressed data of the graph code generator matrix, the compression index and $p_i'$ are read, and the above-described processing is performed after restoring $p_i$ from $p_i'$. Similarly, in a case in which $p_i''$ is stored, the compression index and $p_i''$ are read, and the above-described processing is performed after restoring pi from $p_i''$.

Returning to the description of FIG. 25, the coding unit 263*a* executes Step S13 using the decompressed $g_i$, as similarly to the first embodiment, subsequently to Step S32.

Incidentally, the decoding processing of the second embodiment is the same as that of the first embodiment.

Although the example of b=1 has been described In the above description, it is possible to compress the graph code generator matrix in the same manner even in a case in which b is two or more. FIG. 27 is a diagram illustrating a compressed image in a case in which the block size is six. FIG. 27 illustrates an example in which the block size is six, and the respective component codes include two blocks. The small square illustrated in FIG. 27 represents one symbol. The hatched square represents the information section of the component code.

In the example of FIG. 27, one block of the second half (the right side of FIG. 27), which is one of the two blocks forming Component Code 1, is one block of the first half (the left side of FIG. 27) of Component Code 2, and one block of the second half of Component Code 2 is one block of the second half of Component Code 3. Further, a sequence represented by the ordered vertex cover is set to the sequence of a vertex in association with Component Code 1, a vertex in association with Component Code 2, and a vertex in association with Component Code 3. In such a case, a parity section (the part which is not hatched) of Component Code 1 can be generated from the information section of Component Code 1, and thus, this part of the graph code generator matrix is not necessarily saved. The front-half block of Component Code 2 is saved or generated as the second-half block of the component code, and thus, this part of the graph code generator matrix is not necessarily saved. Further, a parity section of the second-half block of Component Code 2 can be generated from the information section of Component Code 2, and thus, this part of the graph code generator matrix is not necessarily saved. Accordingly, the part in association with the information section of the second-half block of Component Code 2 is saved in Component Code 2. Further, the second-half block of Component Code 3 is saved or generated as the second-half block of the component code, and thus, this part of the graph code generator matrix is not necessarily saved. Accordingly, the part in association with the front-half block of Component Code 3 is saved.

Further, similarly the first embodiment, the graph code generator matrix forming unit 261, the information section index calculation unit 262 and the compression unit 265, which perform the process of generating the coding and decoding data, may be configured as a different calculation data generating unit from the coding processor 26a outside the coding processor 26.

The above-described calculation data generating unit can be provided in an arbitrary location in the memory controller 2. The calculation data generating unit is provided with the graph code generator matrix forming unit 261, the information section index calculation unit 262, the compression unit 265 and the storage unit. The block map and the block size, the ordered vertex cover and the component code information section index are stored in advance in the storage unit of the calculation data generating unit, and the graph code generator matrix, the information section index data, and the graph code generator matrix compressed data generated by the graph code generator matrix forming unit 261, the information section index calculation unit 262, and the compression unit 265 are stored in the storage unit. Further, the graph code generator matrix compressed data stored in the storage unit is copied onto the storage unit 264 of the coding processor 26a. In such a case, the coding processor 26a serves as the coding arithmetic unit 300a illustrated in FIG. 2.

In addition, the calculation data generating unit may be provided outside the memory system 1 similar to the first embodiment. For example, the calculation data generating unit may be realized using an information processing device such as a computer.

As above, the graph code generator matrix is compressed, the row vector of the row in association with the part of which the information vector is non-zero in the compressed data is decompressed in the coding processing to be used in the coding of the graph code in the second embodiment. Thus, it is possible to reduce the calculation amount of the coding, and further, to reduce the memory area for storing the graph code generator matrix. Further, it is possible to read the component code having a long code length when using the full M-partite graph code, and thus, it is possible to improve the correction performance. Further, it is possible to easily improve the compression efficiency when using the full M-partite graph code.

Further, correction such as shortening or puncturing may be performed with respect to the codeword of the graph code described in the first and embodiments. The shortening is a process of coding a part of information to zero, and erasing the information part set to zero from an obtained codeword. The puncturing is a process of removing a part of a codeword, that is, performing thinning. Accordingly, it is possible to improve the degree of freedom in the code length.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory; and
circuitry configured to
generate a codeword by performing coding of a graph code using a graph of which a side is associated with a block, the block being a part of user data and having one or more symbols at which component codes intersect one another;
store the codeword in the non-volatile memory; and
perform error correction on the user data in accordance with the codeword.

2. The memory system according to claim 1, wherein the circuitry is configured to
calculate a graph code information section index, which is information indicating a position of a component in association with an information section of the codeword in a generator matrix to be used in coding of the graph code;
extract a second received word from a first received word, the first received word being a received word in association with the codeword read from the non-volatile memory, the second received word being a received word in association with a codeword of the component code of the graph code;
decode the second received word; and
convert the codeword to be obtained based on a decoding result of the component code decoding unit into the user data based on the graph code information section index.

3. The memory system according to claim 2, wherein the graph code information section index is a value that indicates a starting row of a non-zero component for every row of a row-reduced echelon matrix to be obtained by transforming the generator matrix.

4. The memory system according to claim 1, wherein when M is an integer of two or more, the graph code is a full M-partite graph code.

5. The memory system according to claim 1, wherein the circuitry is configured to generate the codeword by performing shortening or puncturing on a coding result of the graph code.

6. The memory system according to claim 1, wherein the component code is a systematic code.

7. The memory system according to claim 1, wherein the circuitry is configured to
decompress a generator matrix based on compressed data obtained by compressing the generator matrix of the graph code, the compressed data being data in association with an information section of the component code in the generator matrix,
wherein the circuitry is configured to perform coding of the graph code using the generator matrix with respect to the user data.

8. A memory system comprising:
a non-volatile memory; and
circuitry configured to
decompress a generator matrix based on compressed data obtained by compressing the generator matrix of a graph code, the compressed data being data in association with an information section of a component code in the generator matrix;
generate a codeword by performing coding of the graph code using the generator matrix with respect to user data;
store the codeword in the non-volatile memory; and
perform error correction on the user data in accordance with the codeword.

9. The memory system according to claim 8, wherein the compressed data is generated, based on connection information indicating a connection relationship with a vertex in the graph code, a component code information section index indicating the information section of the component code in association with the vertex, and sequence information indicating a sequence of a vertex to be processed, by sequentially adding data to be already included in the compressed data, to the compressed data, among data in association with the information section of the component code for every component code associated with the vertex in the generator matrix.

10. The memory system according to claim 8, wherein the circuitry is further configured to calculate a graph code information section index, which is information indicating a position of a component in association with an information section of the codeword in a generator matrix to be used in coding of the graph code;

extract a second received word from a first received word, the first received word being a received word in association with the codeword read from the non-volatile memory, the second received word being a received word in association with a codeword of the component code of the graph code;

decode the second received word; and convert the codeword to be obtained based on a decoding result of the component code decoding unit into the user data based on the graph code information section index.

11. The memory system according to claim 10, wherein the graph code information section index is a value that indicates a starting row of a non-zero component for every row of a row-reduced echelon matrix to be obtained by transforming the generator matrix.

12. The memory system according to claim 8, wherein when M is an integer of two or more, the graph code is a full M-partite graph code.

13. The memory system according to claim 8, wherein the circuitry is configured to decompress data of a row in association with a component of which the user data becomes non-zero among the compressed data.

14. The memory system according to claim 8, wherein the circuitry is configured to generate the codeword by performing shortening or puncturing on a coding result of the graph code.

15. The memory system according to claim 8, wherein the component code is a systematic code.

16. A memory control method comprising:

setting, using a circuitry, a part at which component codes intersect one another as a block including one or more symbols;

generating, using the circuitry, a codeword by performing coding of a graph code using a graph of which a side is associated with a block, the block being a part of user data and having one or more symbols at which component codes intersect one another;

storing, using the circuitry, the codeword in a non-volatile memory; and performing, using the circuitry, error correction on the user data in accordance with the codeword.

* * * * *